United States Patent
Narazaki

(10) Patent No.: US 8,124,533 B2
(45) Date of Patent: Feb. 28, 2012

(54) METHOD OF MANUFACTURING POWER SEMICONDUCTOR DEVICE

(75) Inventor: Atsushi Narazaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 114 days.

(21) Appl. No.: 12/558,999

(22) Filed: Sep. 14, 2009

(65) Prior Publication Data

US 2010/0240183 A1 Sep. 23, 2010

(30) Foreign Application Priority Data

Mar. 17, 2009 (JP) ................................. 2009-064144

(51) Int. Cl.
*H01L 21/311* (2006.01)

(52) U.S. Cl. ................. 438/700; 438/510; 438/514

(58) Field of Classification Search ........... 438/700, 438/197, 506, 508, 510, 514, 680, 667, 671, 438/672; 257/E21.17, 27, 43, 44, 51, 58, 257/135, 379

See application file for complete search history.

(56) References Cited

U.S. PATENT DOCUMENTS

| | | | |
|---|---|---|---|
| 5,378,655 A * | 1/1995 | Hutchings et al. | 438/197 |
| 6,498,071 B2 * | 12/2002 | Hijzen et al. | 438/425 |
| 6,506,646 B1 * | 1/2003 | Miyagi | 438/257 |
| 6,683,346 B2 * | 1/2004 | Zeng | 257/330 |
| 7,075,149 B2 * | 7/2006 | Sato et al. | 257/335 |
| 2002/0081795 A1 * | 6/2002 | Kim et al. | 438/200 |

FOREIGN PATENT DOCUMENTS

| | | |
|---|---|---|
| JP | 9-172064 | 6/1997 |
| JP | 9-246550 | 9/1997 |
| JP | 2007-266233 | 10/2007 |
| JP | 2007-311627 | 11/2007 |
| KR | 10-0579775 | 5/2004 |

OTHER PUBLICATIONS

Office Action issued Oct. 25, 2010, in German Patent Application No. 10 2009 053 158.0-33 (with English translation).
Office Action issued Feb. 17, 2011, in Korea Patent Application No. 10-2009-0106307 (with English translation).

* cited by examiner

*Primary Examiner* — David Nhu

(74) *Attorney, Agent, or Firm* — Oblon, Spivak, McClelland, Maier & Neustadt, L.L.P.

(57) ABSTRACT

A mask layer having a plurality of openings is formed on the first layer. A second layer having a second conductivity type different from the first conductivity type is formed on the first layer by introducing impurities using the mask layer. A third layer having the first conductivity type is formed on the second layer by introducing impurities using the mask layer. A trench extending through the second layer and the third layer to the first layer is formed by carrying out etching using an etching mask including at least the mask layer. A gate insulation film covering a sidewall of the trench is formed. A trench gate filling the trench is formed on the gate insulation film.

9 Claims, 42 Drawing Sheets

METHOD OF MANUFACTURING POWER SEMICONDUCTOR DEVICE

BACKGROUND OF THE INVENTION

1. Field of the Invention

The present invention relates to a method of manufacturing a power semiconductor device, and particularly, to a method of manufacturing a power semiconductor device having a trench gate.

2. Description of the Background Art

There are some power semiconductor devices each used as a contactless switch for controlling a large amount of electric power. Such a device for a large amount of electric power is applied, for example, to the inverter circuit of household electric appliances such as an air conditioner, a refrigerator and a washing machine which have implemented improved energy conservation, and to the motor control for trains such as a bullet train and a subway train. In recent years, in consideration of the global environment, the power semiconductor device is applied for controlling the inverter and converter of a hybrid vehicle which runs using a combination of the electric motor and the engine, and also applied to a converter used for solar photovoltaic power generation or wind power generation. In this way, the application field of the power semiconductor device has been enlarged.

Furthermore, there are also some power semiconductor devices for controlling a small amount of electric power. Such a semiconductor device includes, for example, a power MOSFET (Metal-Oxide-Semiconductor Field-Effect Transistor) for a small amount of electric power. Such an MOSFET serves as a unipolar device which is suitable for high-speed switching, and accordingly, used for mobile phones and game machines, for example. Furthermore, particularly in the low-withstand-voltage type power MOSFET, finer pattern formation causes an increase in channel width and a high current density, which allows a decrease in the resistance (on-resistance) between the drain and the source during the passage of current.

However, since there is a limit to the finer pattern formation, a trench gate structure may be used for further decreasing the on-resistance of the low-withstand-voltage type power MOSFET. The power MOSFET having a trench gate as described above and the manufacturing method thereof are disclosed, for example, in FIGS. 14-31 of Japanese Patent Laying-Open No. 09-246550.

Furthermore, the trench gate is used not only for an MOSFET but also for an IGBT (Insulated Gate Bipolar Transistor). Such an IGBT is disclosed, for example, in Japanese Patent Laying-Open No. 2007-311627.

The power semiconductor device is required to improve the performance and lower the chip cost. A reduction in chip size is effective in lowering the chip cost. However, in the power semiconductor device for a small amount of electric power not more than 1 A which is in high demand and gains a large market in the field of mobile phones and mobile tools, the chip size has already reached its lower limit, which makes it difficult to further reduce the chip size. Therefore, there is a need for an approach other than that of reducing the chip size to lower the chip cost, and also a need to simplify the manufacturing method as one of the approaches.

SUMMARY OF THE INVENTION

The present invention has been made in light of the above-described problems, and an object of the present invention is to provide a simplified method of manufacturing a power semiconductor device having a trench gate.

The method of manufacturing the power semiconductor device according to the present invention includes the following steps.

A semiconductor substrate having one main surface and an other main surface and including a first layer having a first conductivity type and located at the side of the one main surface is prepared. A mask layer having a plurality of openings is formed on the first layer. A second layer having a second conductivity type different from the first conductivity type is formed on the first layer by introducing impurities using the mask layer. A third layer having the first conductivity type is formed on the second layer by introducing impurities using the mask layer. A trench extending through the second layer and the third layer to the first layer is formed by carrying out etching using an etching mask including at least the mask layer. A gate insulation film covering a sidewall of the trench is formed. A trench gate filling the trench is formed on the gate insulation film.

According to the method of manufacturing the power semiconductor device of the present invention, a mask layer can be used in common when forming each of the second layer, the third layer and the trench. This allows the power semiconductor device having a trench gate to be obtained by a more simplified manufacturing method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the drawings.

First Embodiment

Figure 1:
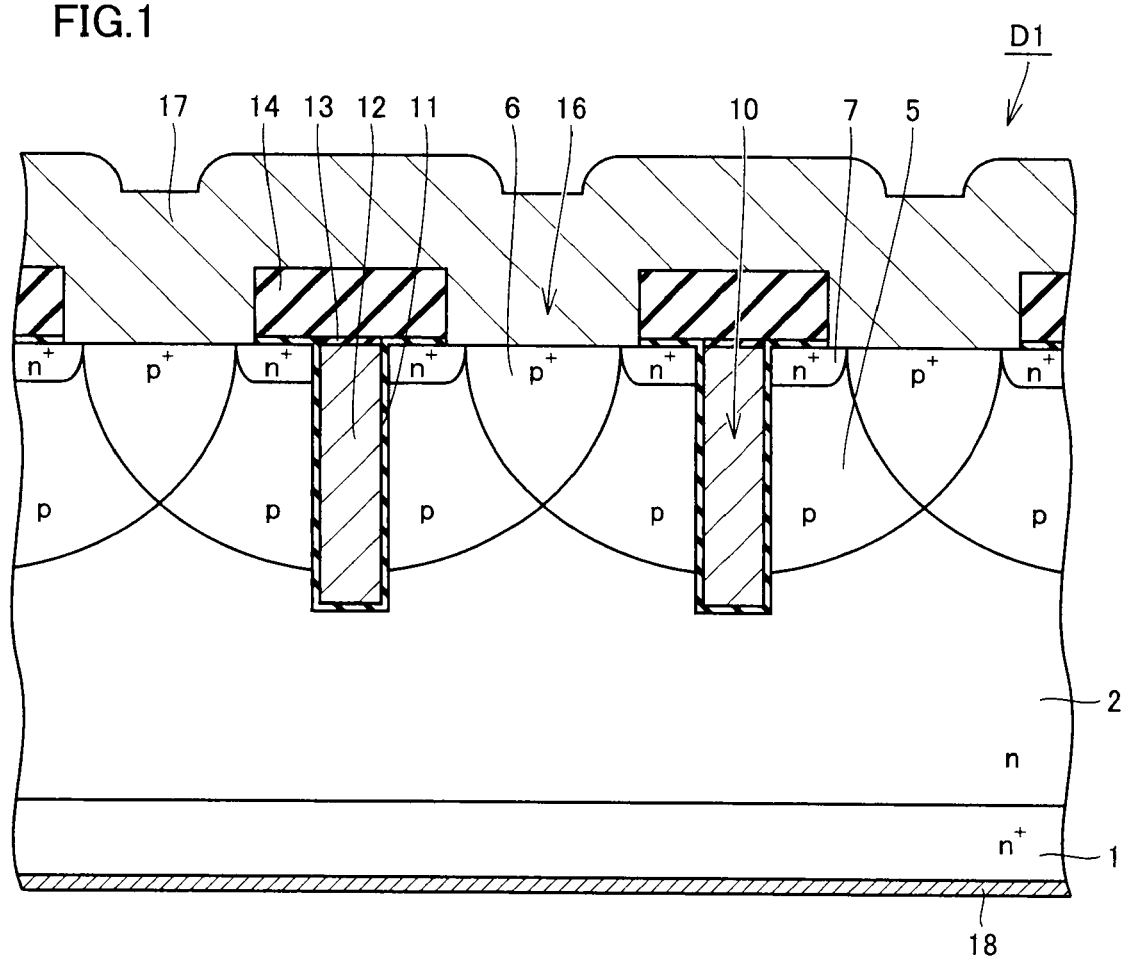
FIG. 1 is a partial cross-sectional view schematically showing a configuration of a power semiconductor device according to a first embodiment of the present invention.

Referring to FIG. 1, a power semiconductor device D1 according to the present embodiment serves as an n-channel type power MOSFET having a trench gate structure. This power semiconductor device D1 includes an $n^+$ layer 1, an n layer 2, a p base region 5, a $p^+$ contact region 6 (high concentration region), an $n^+$ source region 7, a gate oxide film 11, a trench gate 12, oxide films 13 and 14, a source electrode 17, and a drain electrode 18.

$N^+$ layer 1, n layer 2 and $n^+$ source region 7 each are made of an n-type (first conductivity type) semiconductor. Furthermore, $n^+$ layer 1 and $n^+$ source region 7 are higher in impurity concentration than n layer 2. P base region 5 and $p^+$ contact region 6 each are made of a p-type (a second conductivity type different from the first conductivity type) semiconductor. In a source contact 16 formed so as to pass through oxide film 14, source electrode 17 is provided so as to contact each of $p^+$ contact region 6 and $n^+$ source region 7. Drain electrode 18 is provided on the rear surface (underside surface in FIG. 1) of $n^+$ layer 1.

The method of manufacturing power semiconductor device D1 will then be described.

Figure 2:
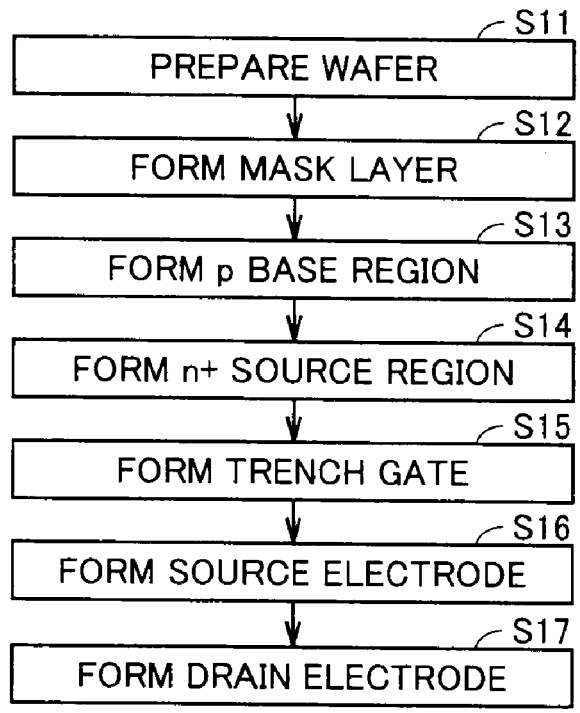
FIG. 2 is a flowchart illustrating a method of manufacturing the power semiconductor device according to the first embodiment of the present invention.
Figure 4:
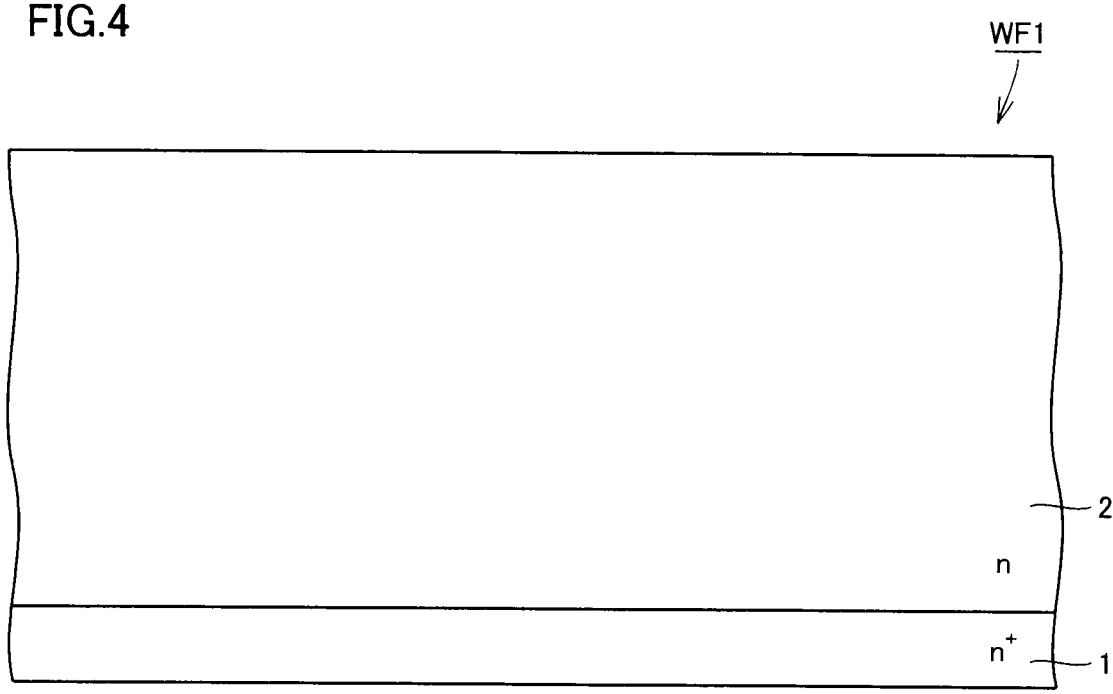
FIGS. 4-22 are partial cross-sectional views schematically showing the first to nineteenth processes, respectively, of the method of manufacturing the power semiconductor device according to the first embodiment of the present invention.

Referring to FIG. 4, a wafer WF1 (semiconductor substrate) having an upper surface (one main surface) and a rear surface (the other main surface) is first prepared (FIG. 2: step S11). Wafer WF1 includes $n^+$ layer 1 and n layer 2 (the first layer). $N^+$ layer 1 is made of an n-type (first conductivity type) semiconductor having a high concentration. N layer 2 is made of an n-type semiconductor having a concentration lower than that of $n^+$ layer 1. N layer 2 is located at the side of the upper surface of wafer WF1. For example, wafer WF1 is formed by epitaxially growing silicon on the silicon substrate as $n^+$ layer 1.

An oxide film 3 having a plurality of openings (FIG. 8) is then formed as a mask layer (FIG. 2: step S12). Specifically, the following processes are carried out.

Figure 5:
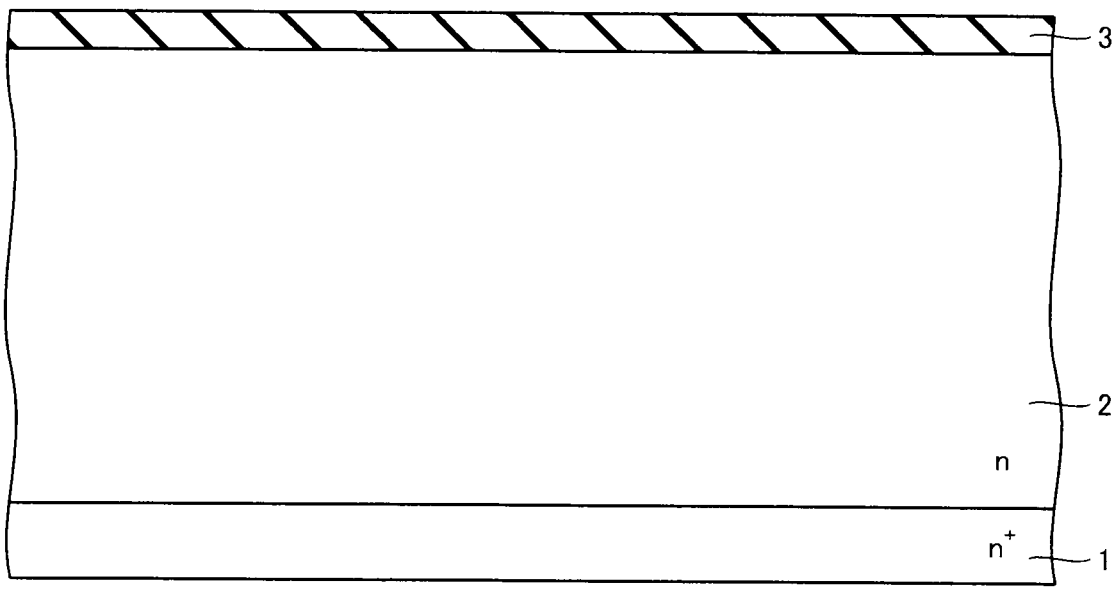

Referring to FIG. 5, oxide film 3 is formed on n layer 2. Oxide film 3 has a film thickness of, for example, 0.5 μm.

Figure 6:
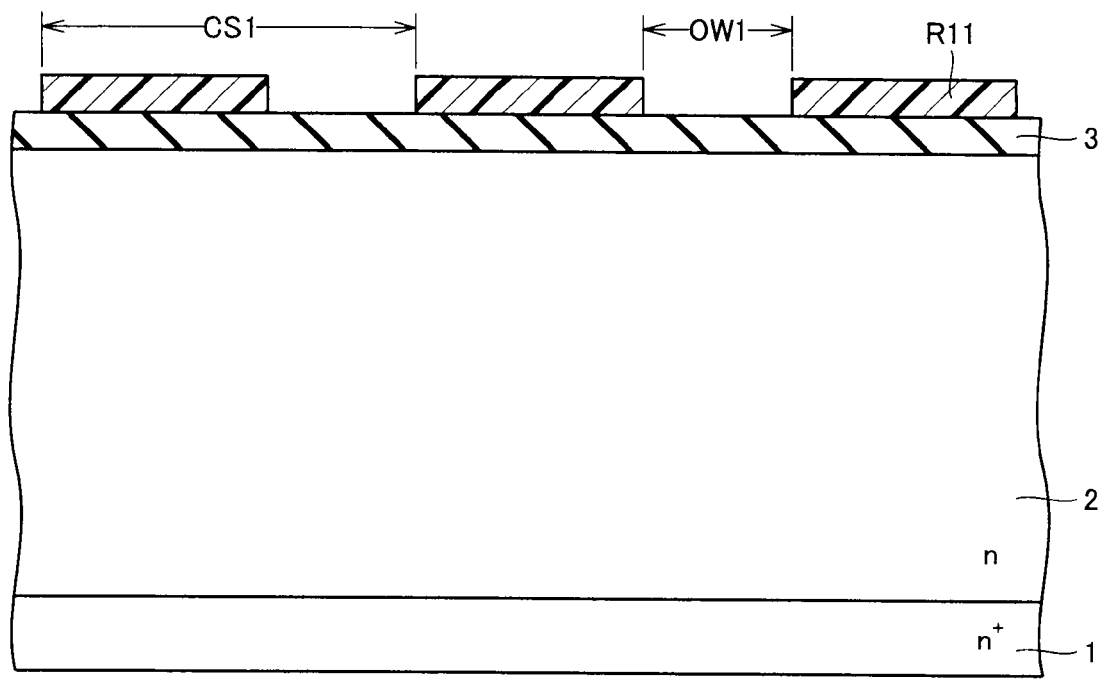

Referring to FIG. 6, a first resist pattern R11 is formed on oxide film 3 by photolithography. First resist pattern R11 has a plurality of openings which are arranged at a pitch equal to a cell size CS1 in one direction (in the lateral direction in FIG. 6). The plurality of openings each have an opening width OW1 in the one direction. For example, cell size CS1 is 5 μm and opening width OW1 is 2 μm.

Figure 7:
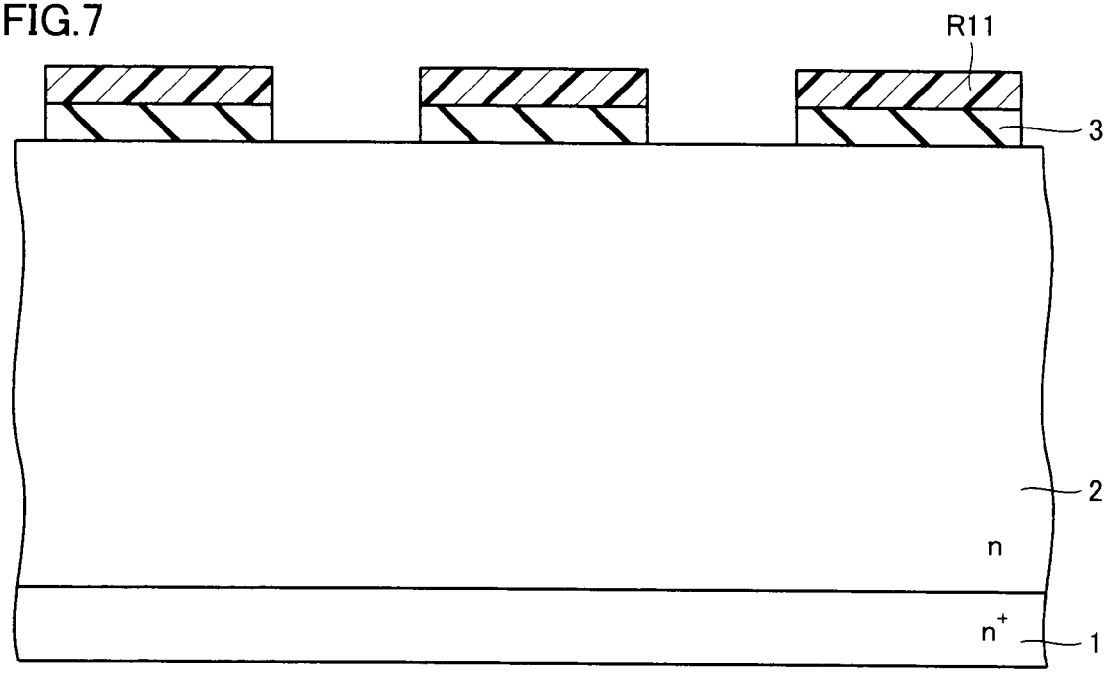
Figure 8:
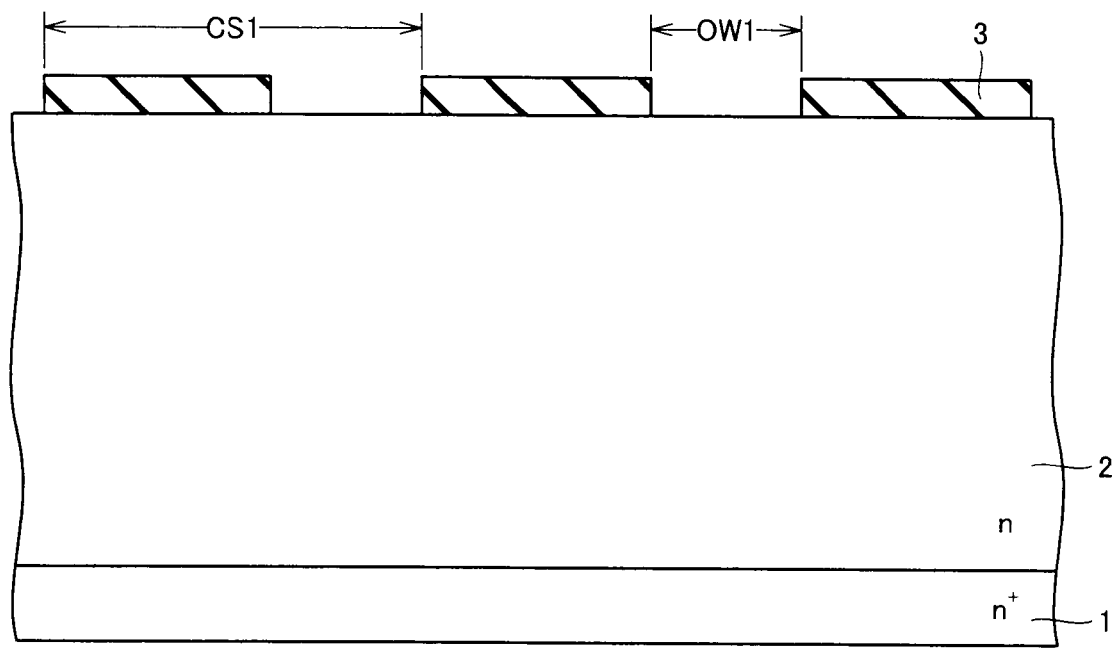

Referring to FIGS. 7 and 8, oxide film 3 is etched using first resist pattern R11 as a mask. First resist pattern R11 is then removed.

A mask layer made of oxide film 3 is formed by the above-described processes in FIGS. 5-8. Accordingly, the pattern of the mask layer corresponds to that of first resist pattern R11.

Figure 9:
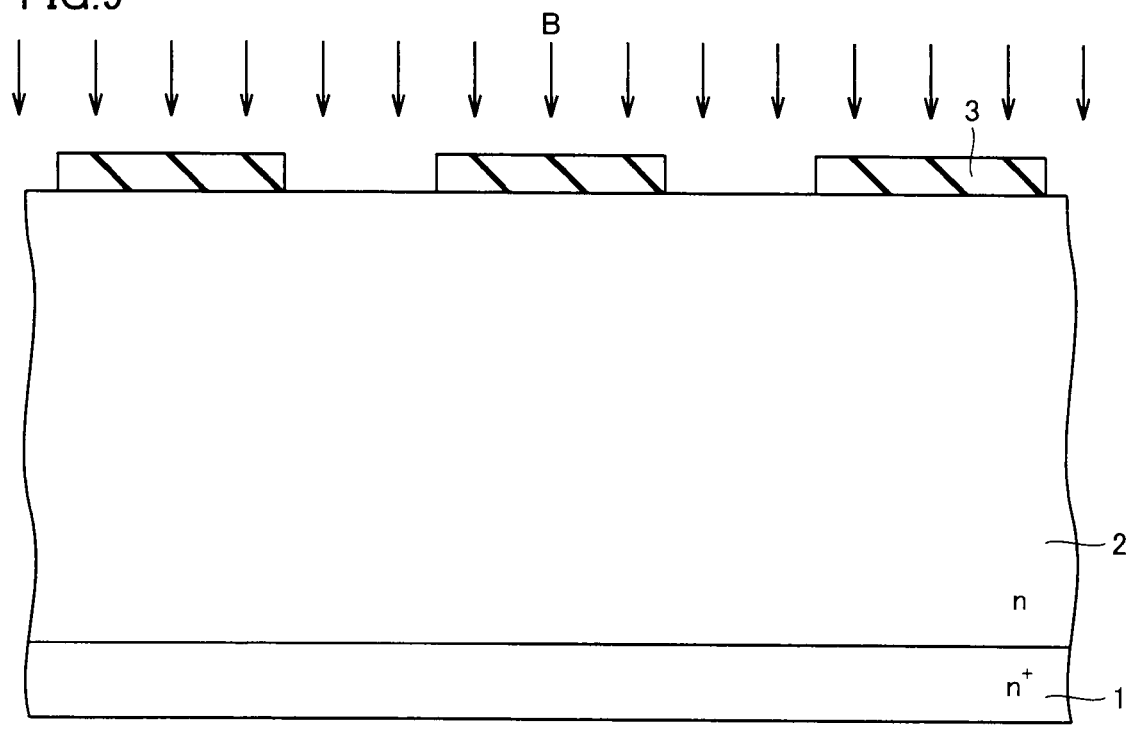

Referring to FIG. 9, the mask layer made of oxide film 3 is used to implant boron (B) ions as impurities for imparting a p-type conductivity type (second conductivity type).

Figure 10:
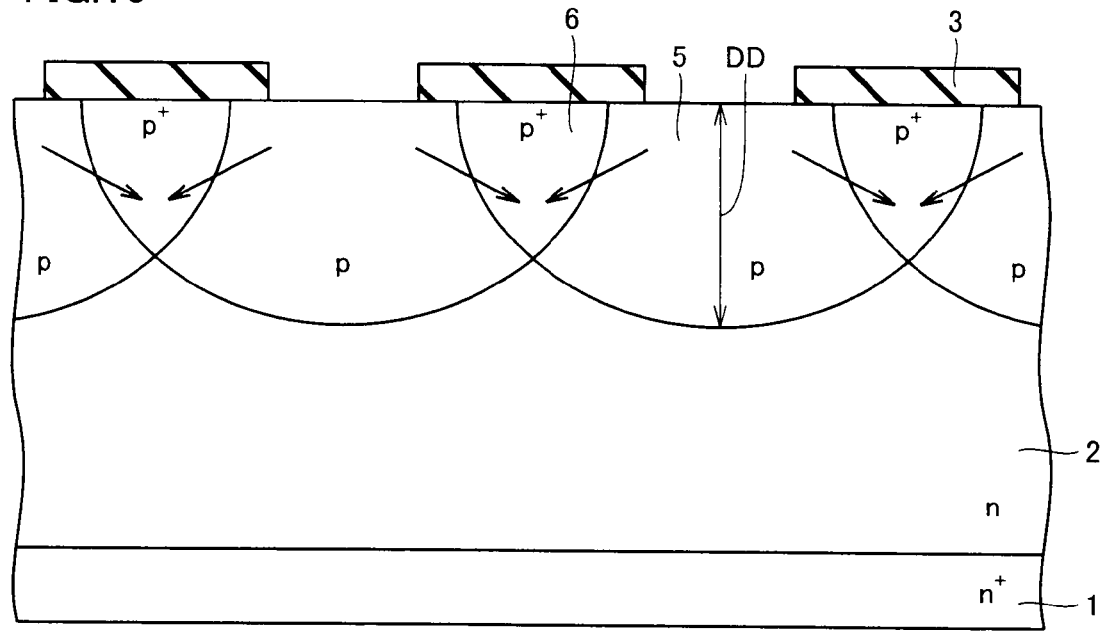

Referring to FIG. 10, the implanted boron is diffused by drive-in. Consequently, p base region 5 (the second layer) is formed in an area on n layer 2 and in the opening of oxide film 3 and in proximity thereto in plan view (FIG. 2: step S13).

When forming p base region 5, boron is diffused into an area located on n layer 2 and covered with oxide film 3 from each of a pair of openings adjacent to each other among the plurality of openings in oxide film 3. Consequently, $p^+$ contact region 6 is formed in the area on n layer 2 and between p base regions 5 adjacent to each other in plan view. In contrast to p base region 5, $p^+$ contact region 6 is a region that is subjected to boron diffusion from both sides (right and left sides in FIG. 10) during drive-in (double diffusion region). This causes $p^+$ contact region 6 (high concentration region) to have a boron concentration (impurity concentration) higher at its surface side (upper surface side in FIG. 10) than that of p base region 5 (the second layer).

For example, p base region 5 has a surface concentration of $1 \times 10^{17}$ to $5 \times 10^{17}$ cm$^{-3}$ and a diffusion depth DD of 3 μm. Furthermore, $p^+$ contact region 6 has a diffusion depth of, for example, 2 μm.

Figure 11:
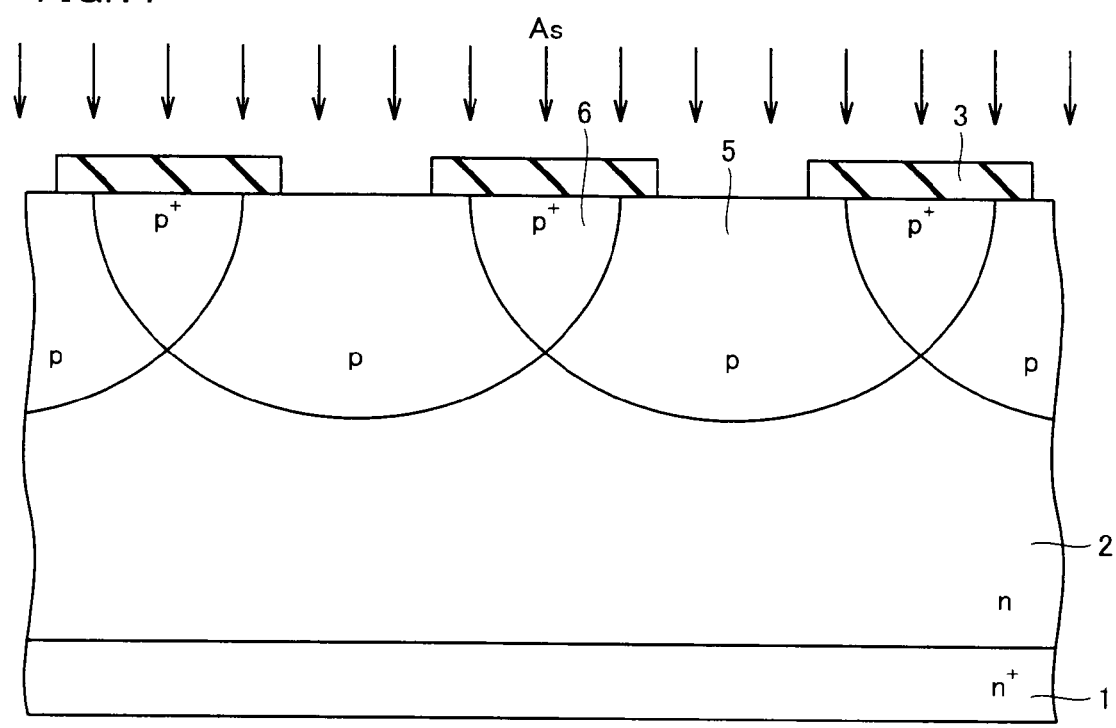

Referring to FIG. 11, the mask layer made of oxide film 3 is then used to implant arsenic (As) ions as impurities for imparting an n-type conductivity type.

Figure 12:
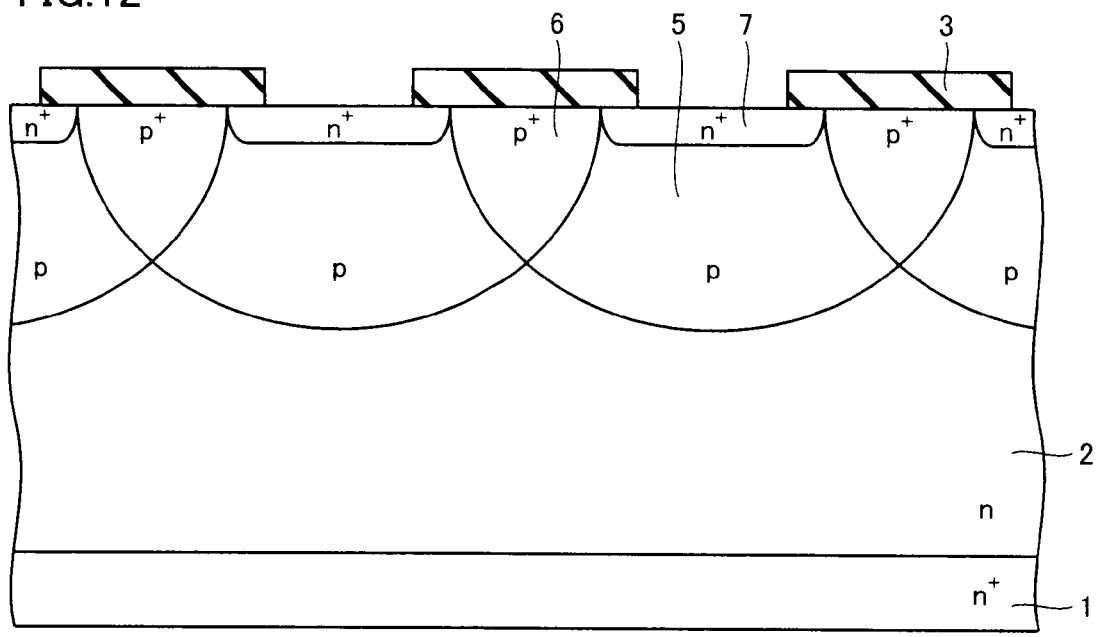

Referring to FIG. 12, the implanted arsenic is diffused by drive-in. Consequently, $n^+$ source region 7 (the third layer) is formed in an area on p base region 5 and in the opening of oxide film 3 and in proximity thereto in plan view (FIG. 2: step S14). For example, $n^+$ source region 7 has a surface concentration of $1 \times 10^{19}$ to $1 \times 10^{20}$ cm$^{-3}$ and a diffusion depth of 0.5 μm.

Trench gate 12 (FIG. 1) is then formed (FIG. 2: step S15). Specifically, the following processes are carried out.

Figure 3:
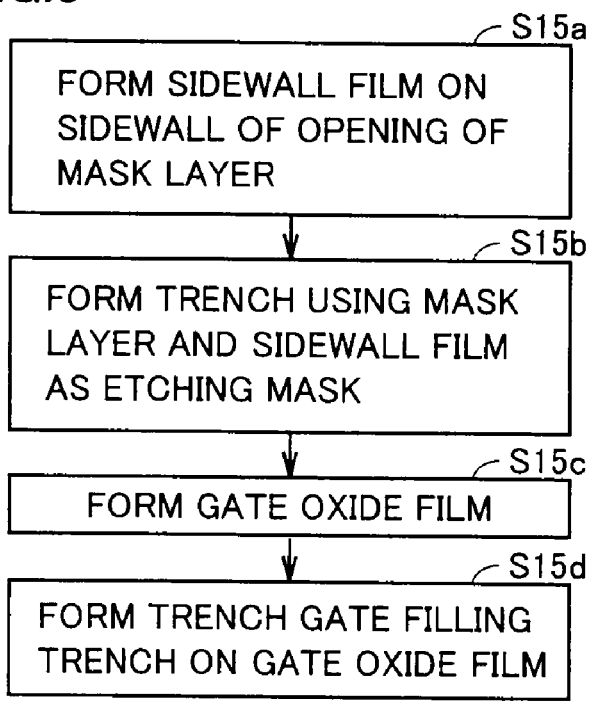
FIG. 3 is a flowchart illustrating a process of forming a trench gate in FIG. 2.
Figure 13:
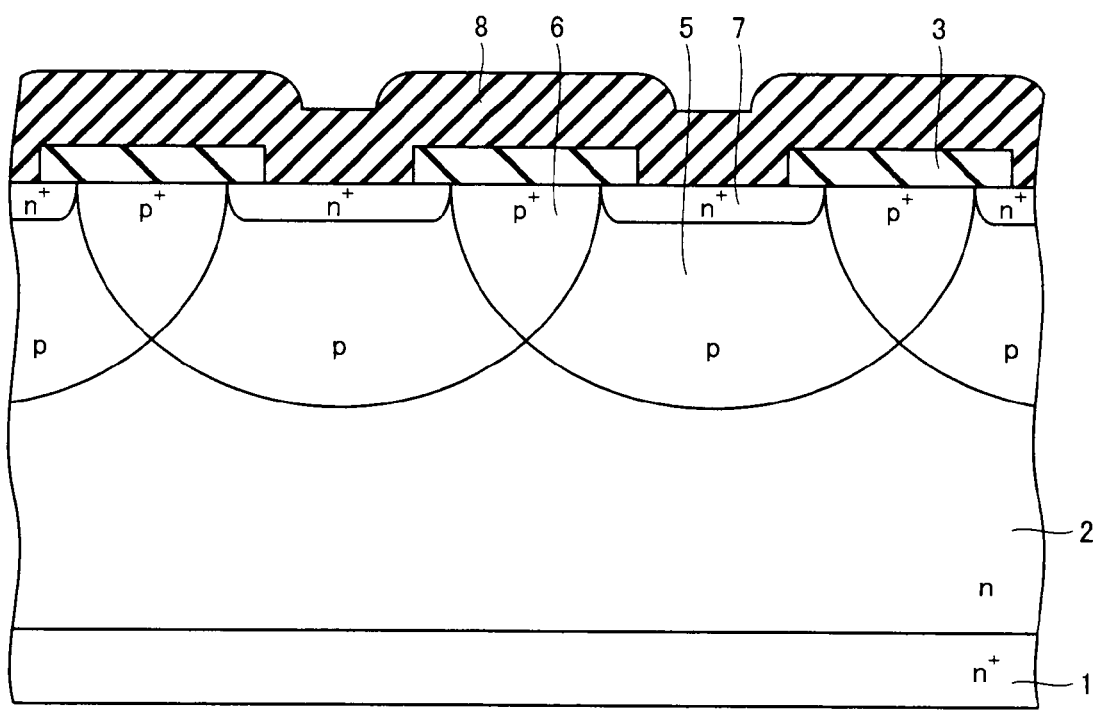
Figure 14:
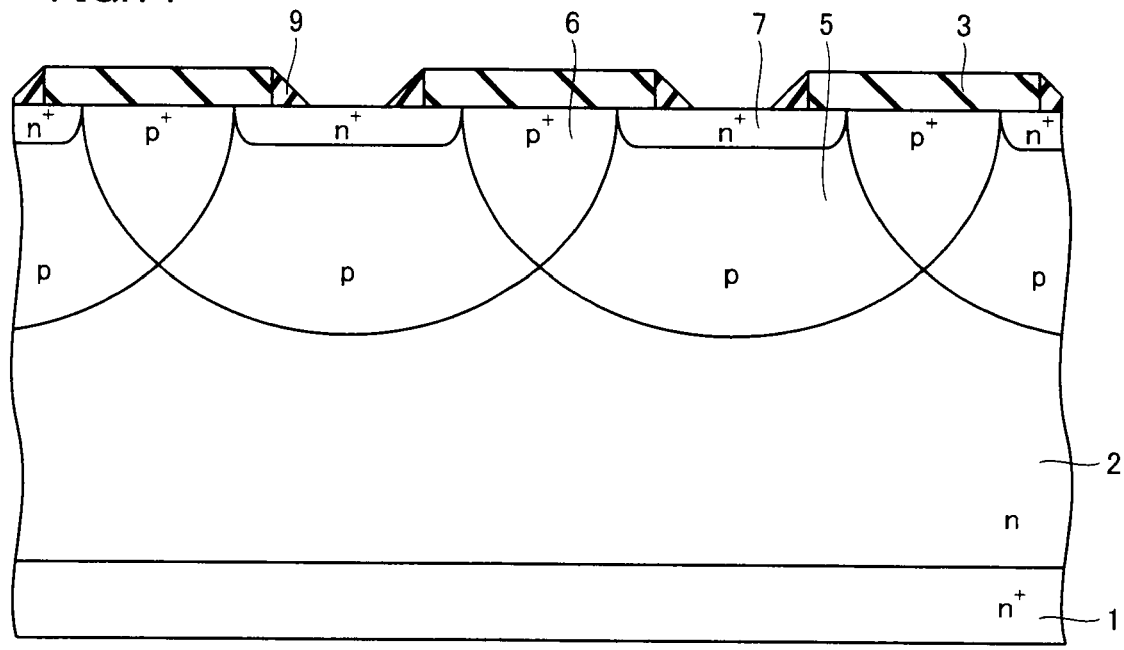

Referring to FIGS. 13 and 14, an oxide film 8 is first formed on the entire upper surface by the CVD (Chemical Vapor Deposition) method. Oxide film 8 is then etched back by anisotropic dry etching, which causes a portion of oxide film 8 on the sidewall of oxide film 3 to be selectively remained to thereby form a sidewall oxide film 9 (sidewall film) (FIG. 3: step S15*a*). Sidewall oxide film 9 serves to frame the opening of oxide film 3 to narrow the opening. The width of the opening narrowed by sidewall oxide film 9 is, for example, 1 µm.

Figure 15:
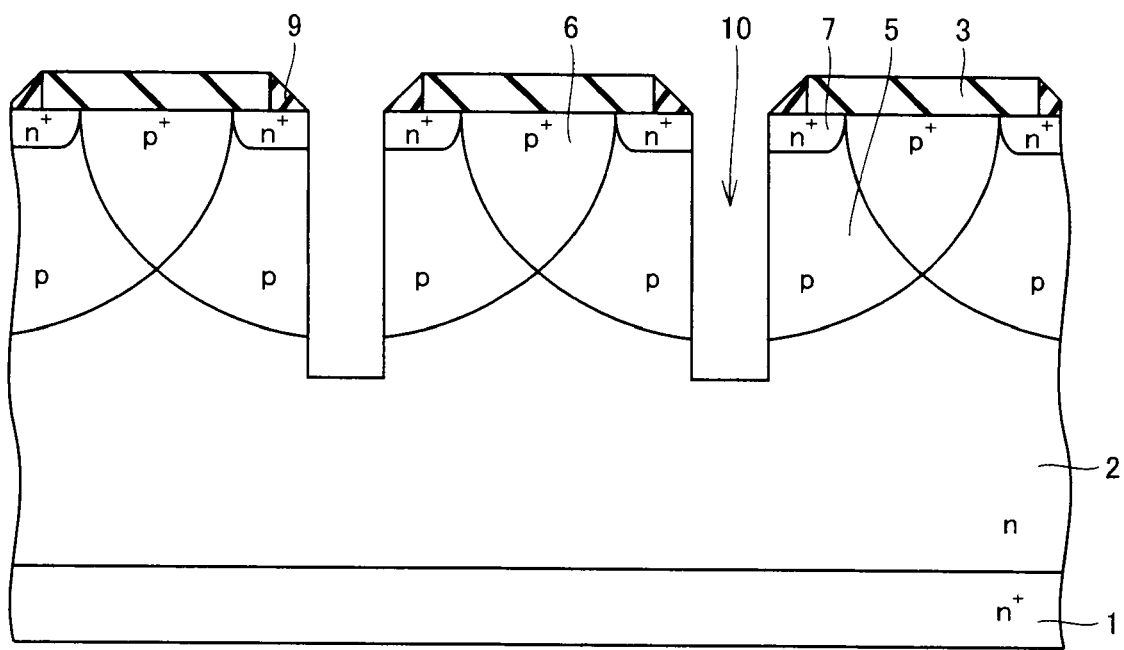
Figure 16:
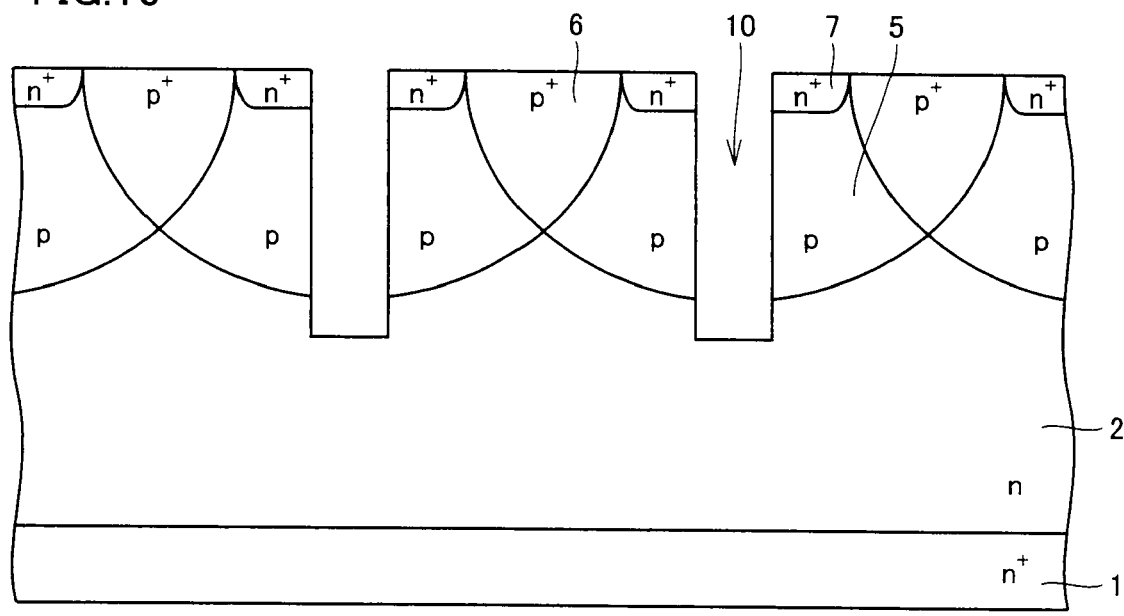

Referring to FIGS. 15 and 16, the etching mask made of oxide film 3 and sidewall oxide film 9 is used to form a trench 10 extending through n$^+$ source region 7 and p base region 5 to n layer 2 (FIG. 3: step S15*b*). Trench 10 has a depth of, for example, 3.5 µm.

Oxide film 3 and sidewall oxide film 9 are then removed.

Figure 17:
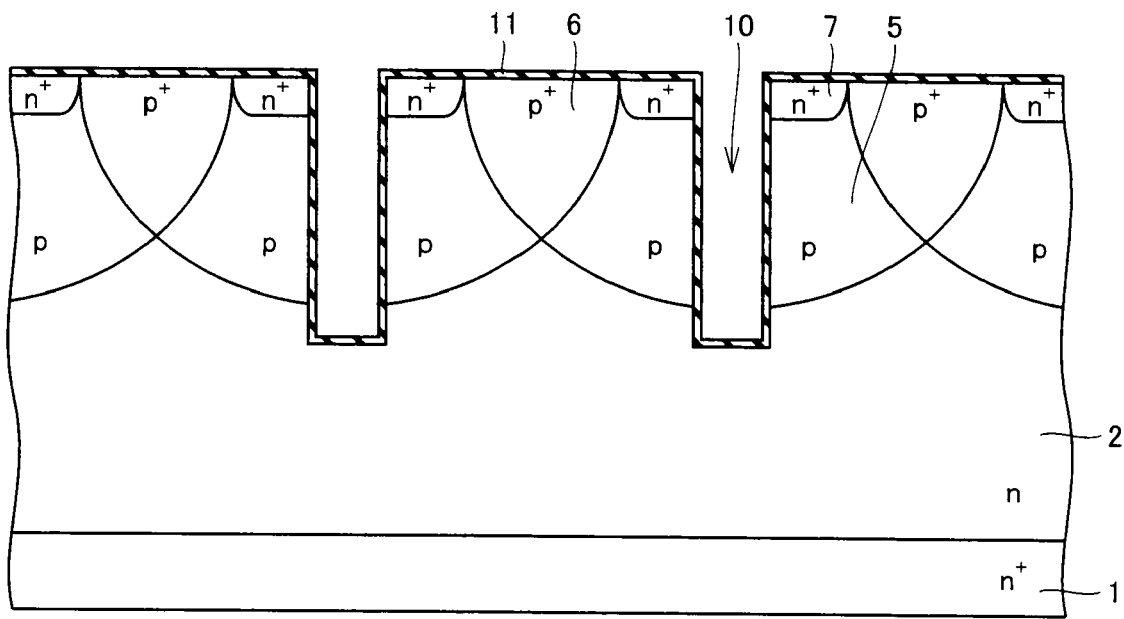

Referring to FIG. 17, gate oxide film 11 is deposited on the entire surface, which causes gate oxide film 11 covering the sidewall of trench 10 to be formed (FIG. 3: step S15*c*). Gate oxide film 11 has a film thickness of, for example, 0.1 µm.

Figure 18:
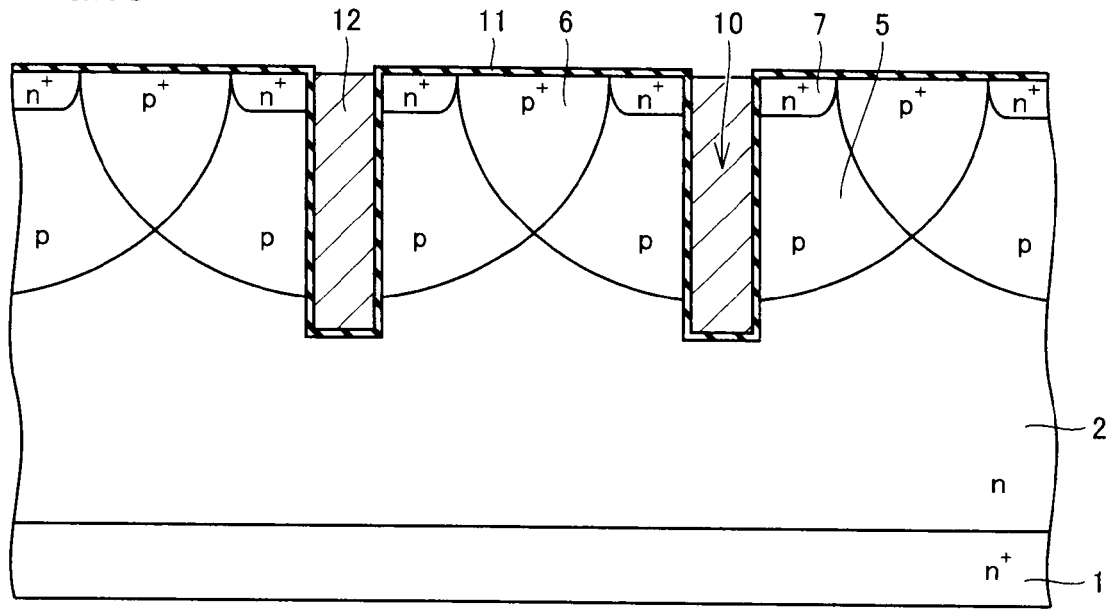

Referring to FIG. 18, a conductive polysilicon film is deposited on the entire surface and then etched back. Consequently, the polysilicon film is remained only inside trench 10 to thereby form trench gate 12 filling trench 10 on gate oxide film 11 (FIG. 3: step S15*d*).

Figure 19:
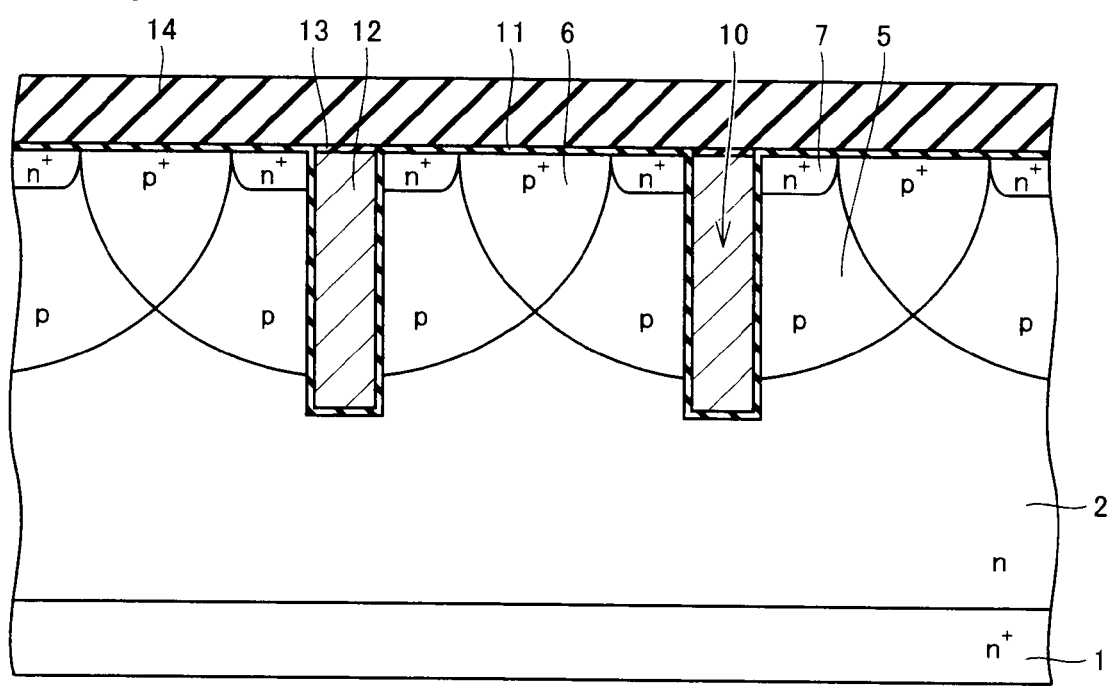

Referring to FIG. 19, oxide film 13 is formed in order to insulate trench gate 12, and oxide film 14 for insulating the gate electrode is further formed on the entire upper surface. Oxide film 14 has a film thickness of, for example, 1 µm.

Figure 20:
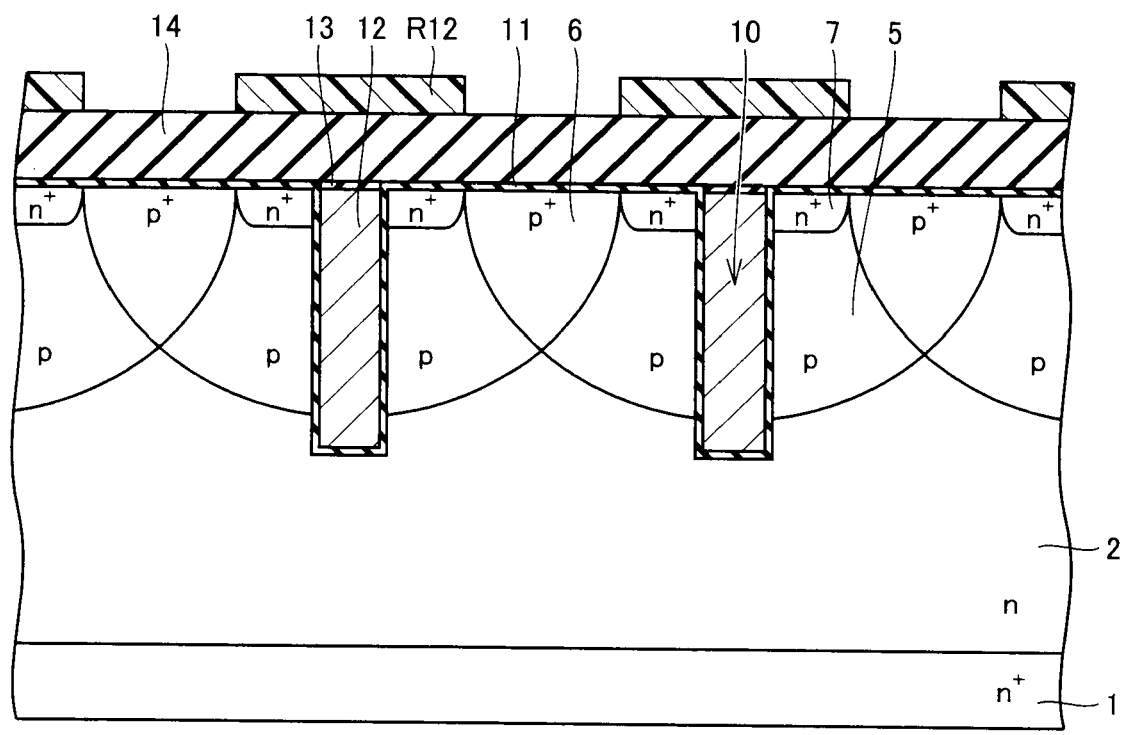
Figure 21:
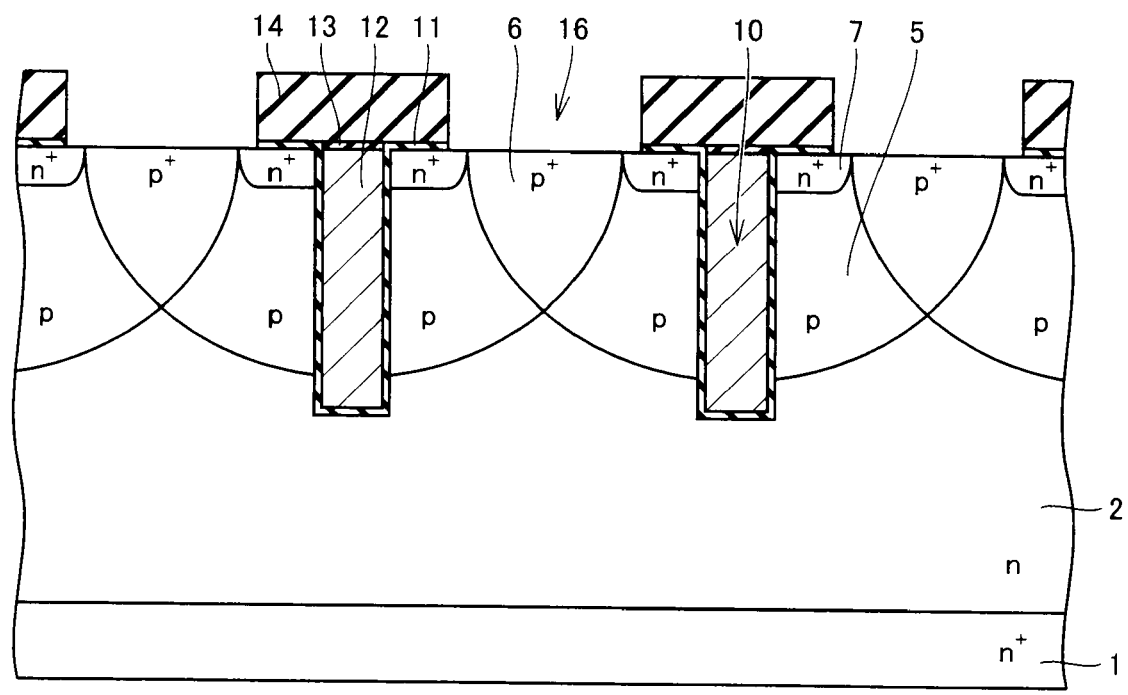

Referring to FIGS. 20 and 21, a second resist pattern R12 is formed on oxide film 14 by photolithography. Second resist pattern R12 has an opening corresponding to source contact 16 (FIG. 1).

As second resist pattern R12 is used as a mask to etch oxide film 14, source contact 16 is formed. Source contact 16 has a width of, for example, 2.5 µm.

Figure 22:
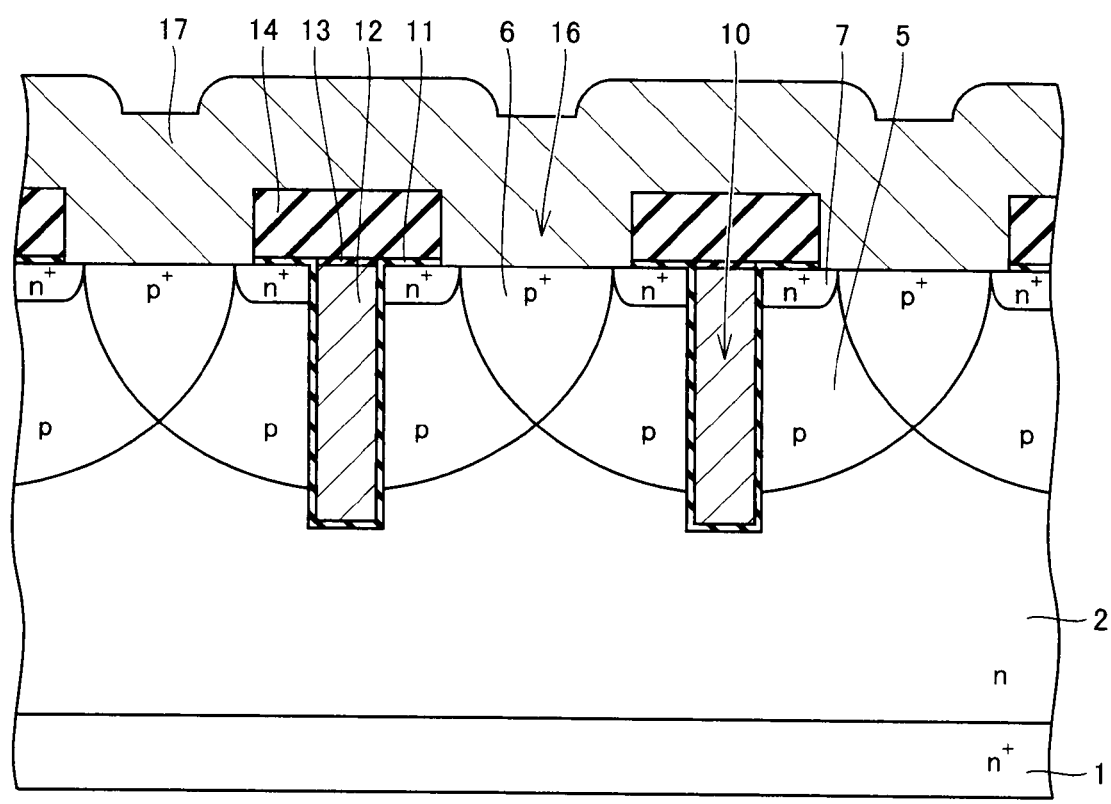

Referring to FIG. 22, source electrode 17 is formed (FIG. 2: step S16). Source electrode 17 is made of material such as aluminum or aluminum silicon, for example. The film thickness of source electrode 17 can be arbitrarily set. More specifically, for example, source electrode 17 is made of aluminum to which 1% of silicon is added, and has a film thickness of 3.6 µm.

Referring back to FIG. 1, drain electrode 18 is formed on the rear surface (underside surface in FIG. 1) of n$^+$ layer 1 (FIG. 2: step S17), to thereby provide a power semiconductor device D1.

Although not explained in the above description, the process of cleaning the wafer, the mask oxidation formation process during boron implantation, the process of forming the gate electrode for electrical connection to the trench gate, the process of forming the overcoating film after formation of the source electrode, the process of forming barrier metal, and the process of grinding the rear surface of the semiconductor substrate may be performed.

The method of manufacturing a power semiconductor device DZ (FIG. 47) as a comparative example will then be described.

Figure 23:
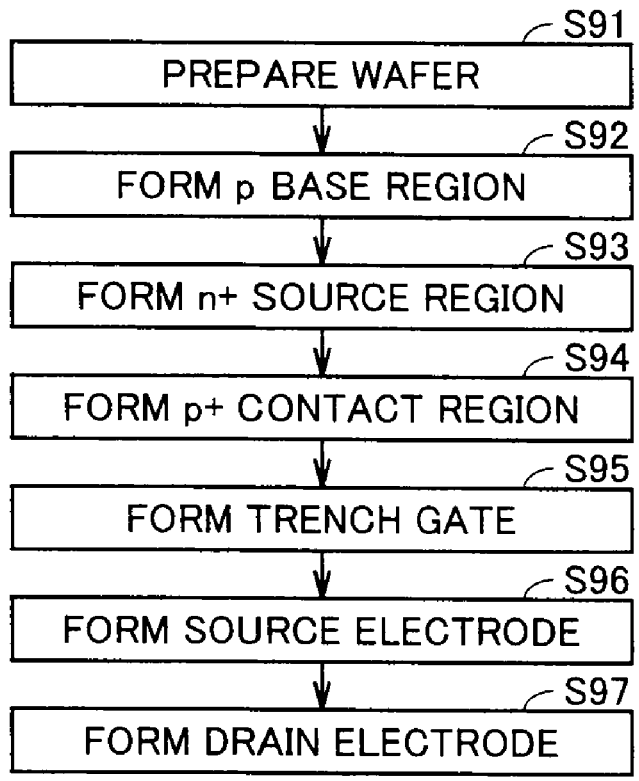
FIG. 23 is a flowchart illustrating the method of manufacturing the power semiconductor device in a comparative example.
Figure 28:
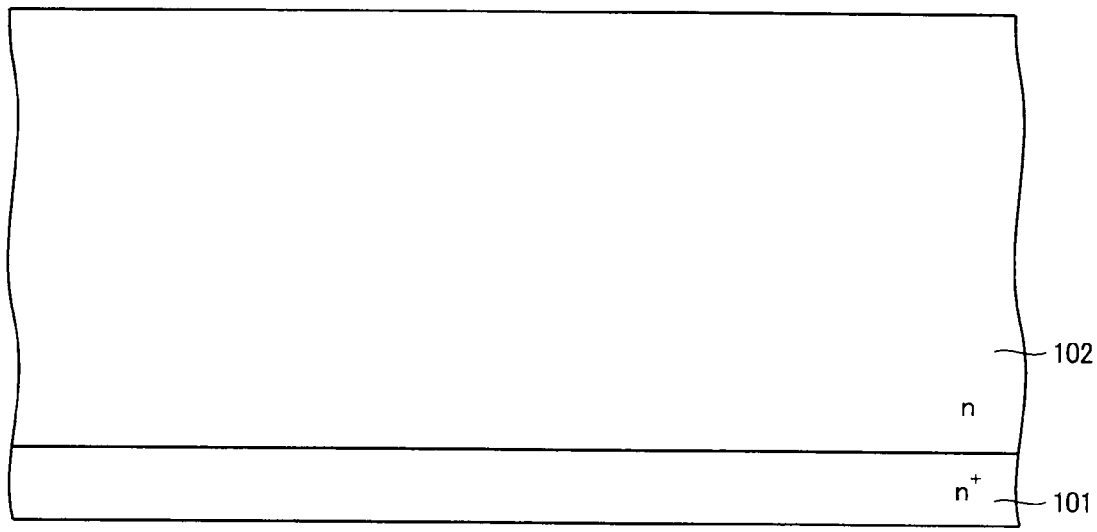
FIGS. 28-47 are partial cross-sectional views schematically showing the first to twentieth processes, respectively, of the method of manufacturing the power semiconductor device in the comparative example.

Referring to FIG. 28, a wafer having an n$^+$ layer 101 and an n layer 102 is prepared (FIG. 23: step S91). This wafer is similar to wafer WF1 (FIG. 4).

A p base region 103 (FIG. 47) is then formed (FIG. 23: step S92). Specifically, the following processes are carried out.

Figure 24:
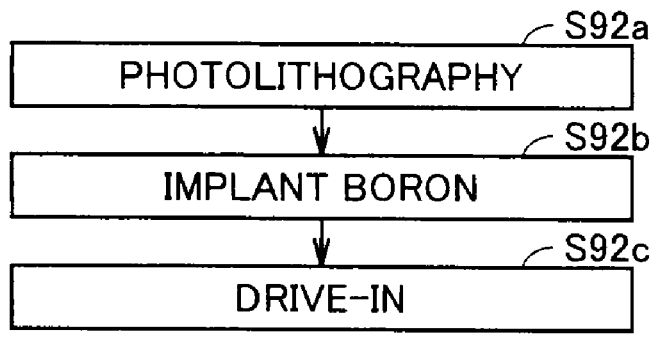
FIG. 24 is a flowchart illustrating a process of forming a p base region in FIG. 23.
Figure 29:
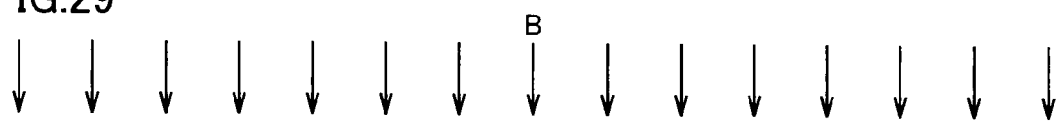
Figure 29:
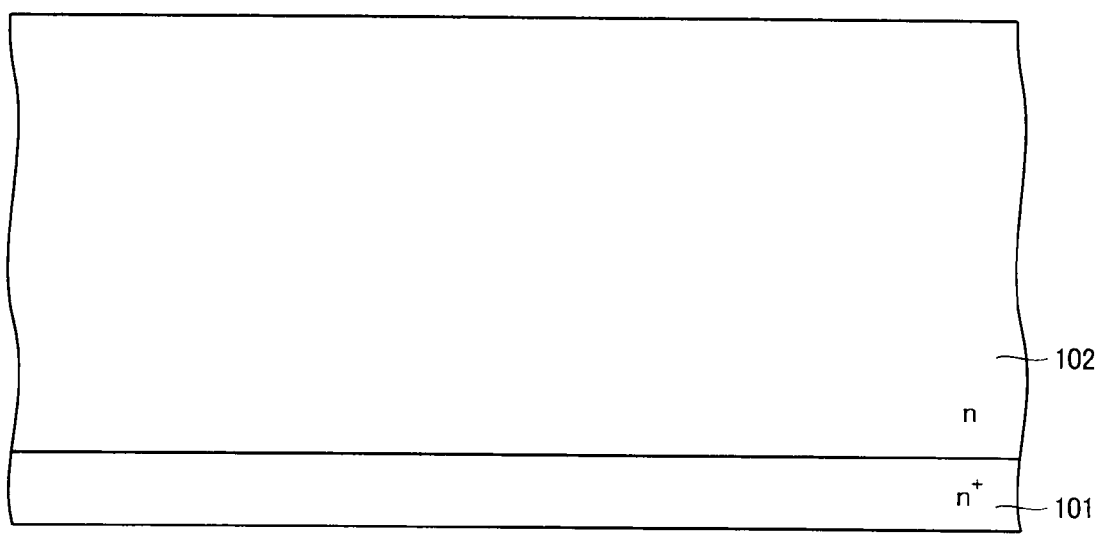
Figure 30:
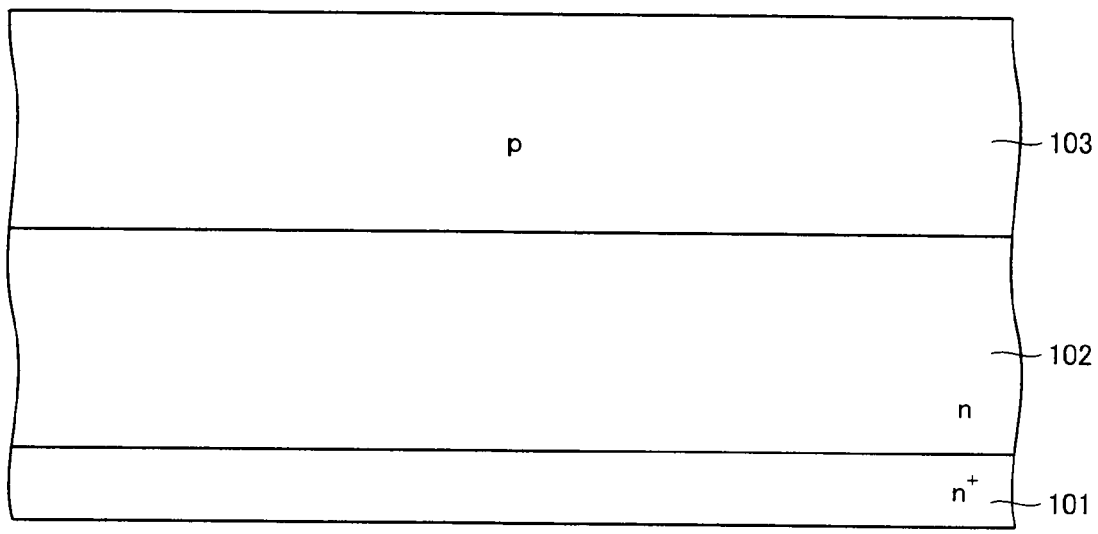

Referring to FIGS. 29 and 30, the region on which a transistor is formed is first exposed and a resist pattern (not shown) covering a region (peripheral region) other than that is formed by photolithography (FIG. 24: step S92*a*). The mask layer formed of this resist pattern is used to implant boron (B) ions (FIG. 24: step S92*b*). After this resist pattern is removed, the implanted boron is diffused by drive-in (FIG. 24: step S92*c*), with the result that p base region 103 is formed on n layer 102.

Then, an n$^+$ source region 105 (FIG. 47) is formed (FIG. 23: step S93). Specifically, the following processes are carried out.

Figure 25:
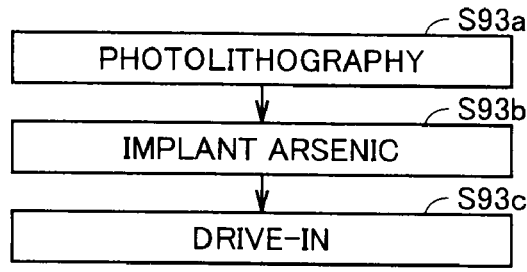
FIG. 25 is a flowchart illustrating a process of forming an $n^+$ source region in FIG. 23.
Figure 31:
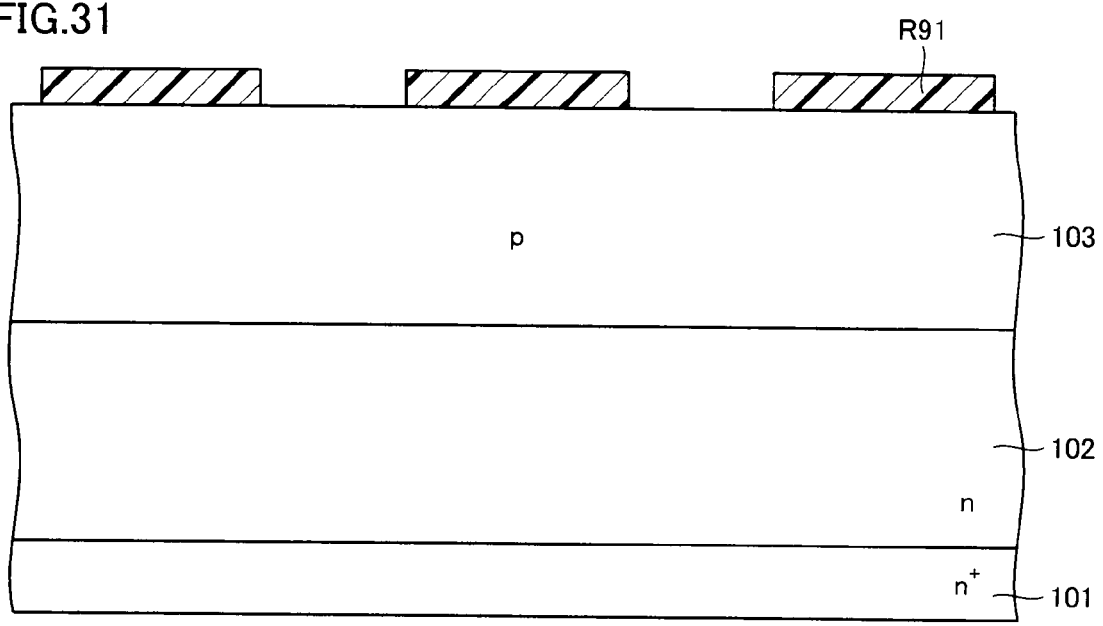
Figure 32:
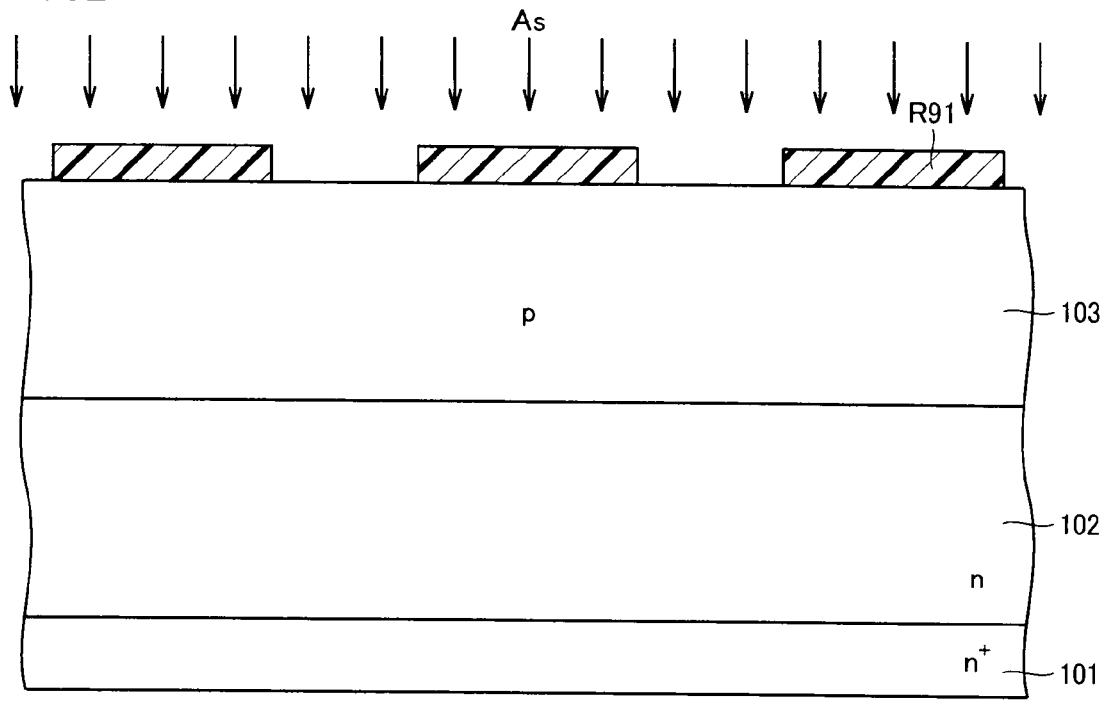
Figure 33:
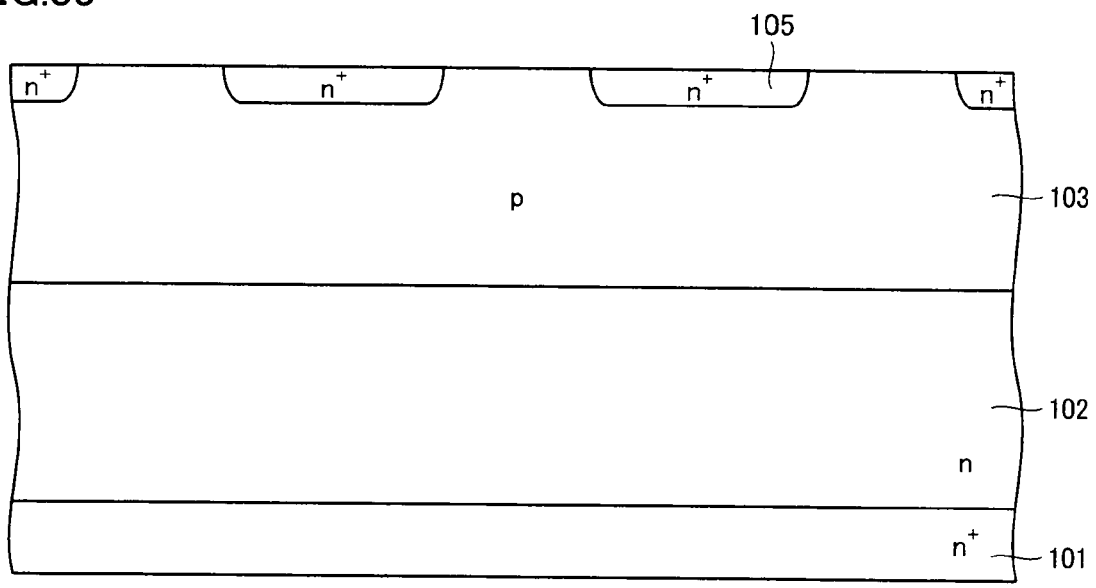

Referring to FIGS. 31-33, a resist pattern R91 is formed on p base region 103 by photolithography (FIG. 25: step S93*a*). The mask layer formed of resist pattern R91 is used to implant arsenic (As) ions (FIG. 25: step S93*b*). After resist pattern R91 is removed, the implanted arsenic is diffused by drive-in (FIG. 25: step S93*c*), with the result that n$^+$ source region 105 is formed.

Then, a p$^+$ contact region 107 (FIG. 47) is formed (FIG. 23: step S94). Specifically, the following processes are carried out.

Figure 26:
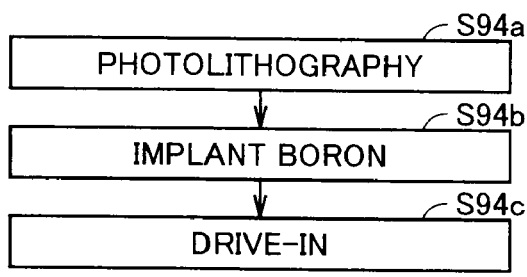
FIG. 26 is a flowchart illustrating a process of forming a $p^+$ contact region in FIG. 23.
Figure 34:
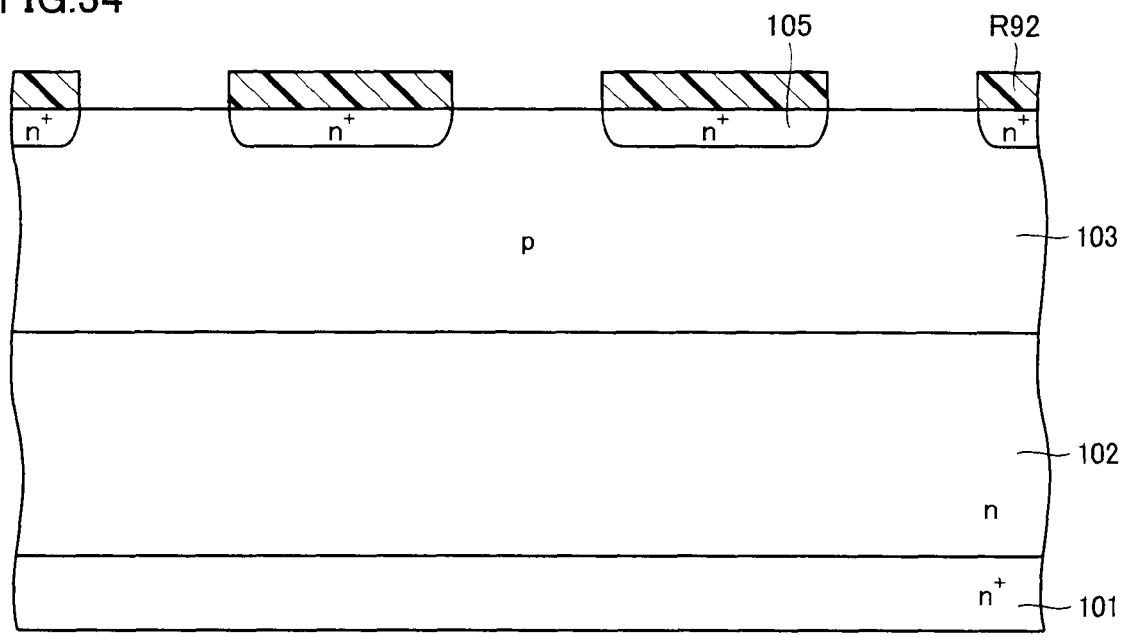
Figure 35:
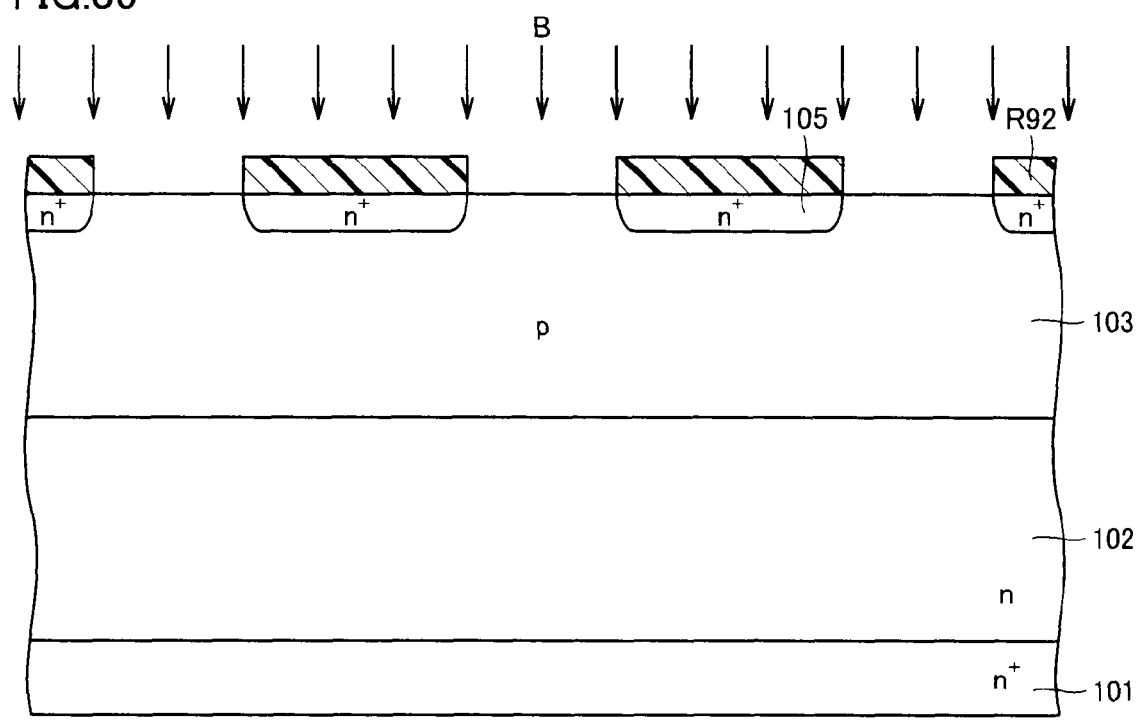
Figure 36:
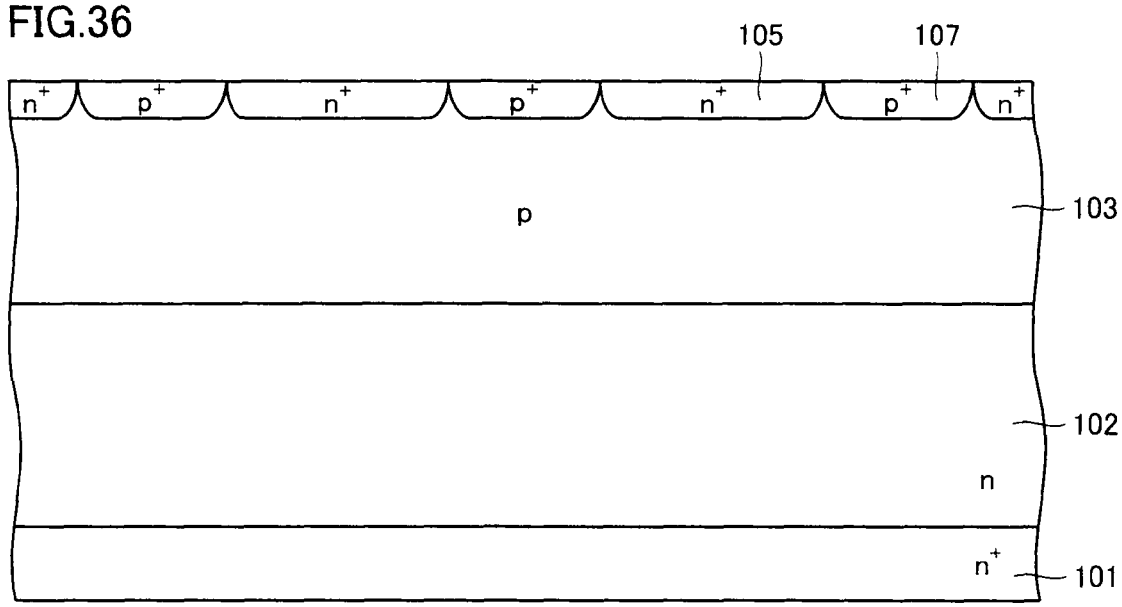
Figure 37:
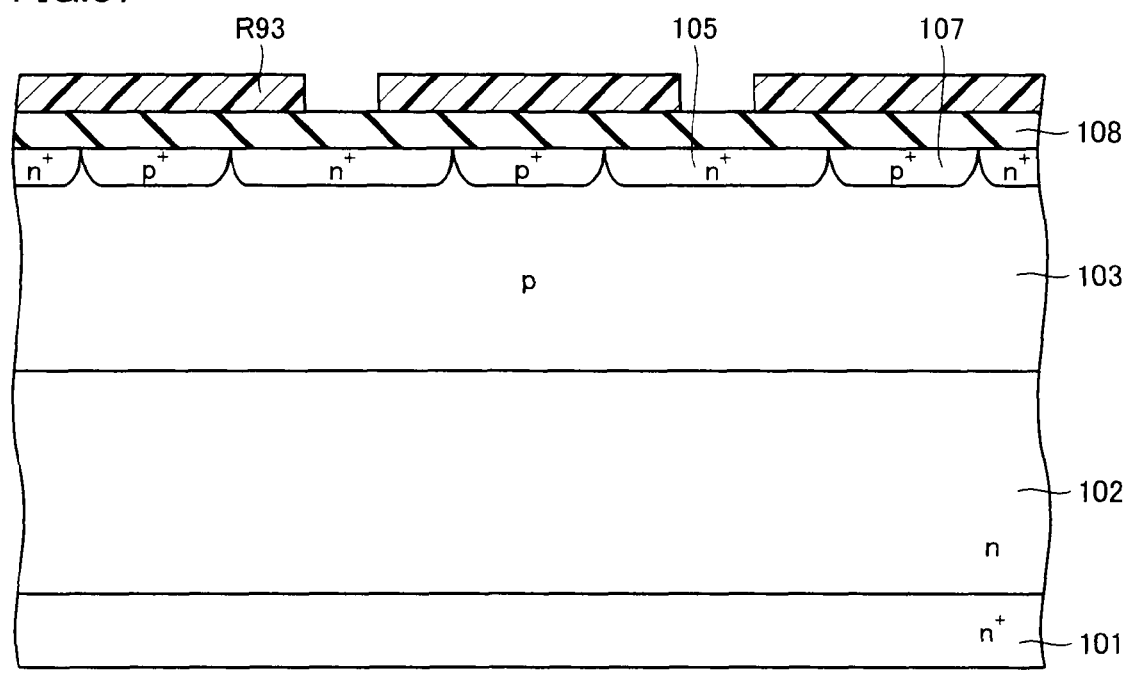
Figure 38:
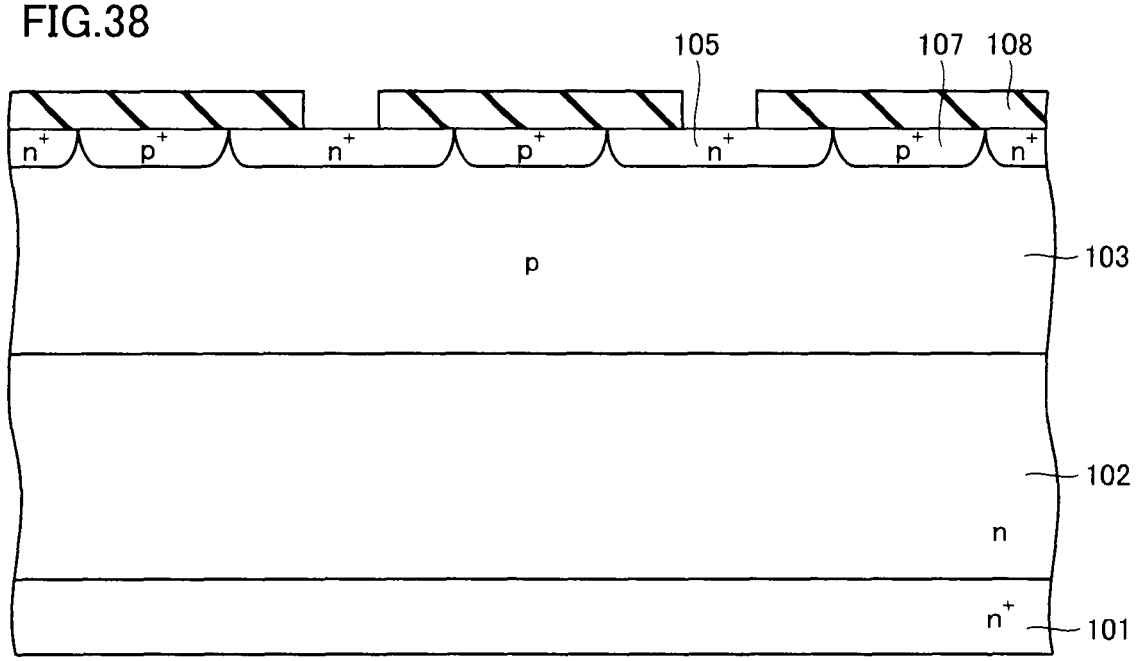
Figure 39:
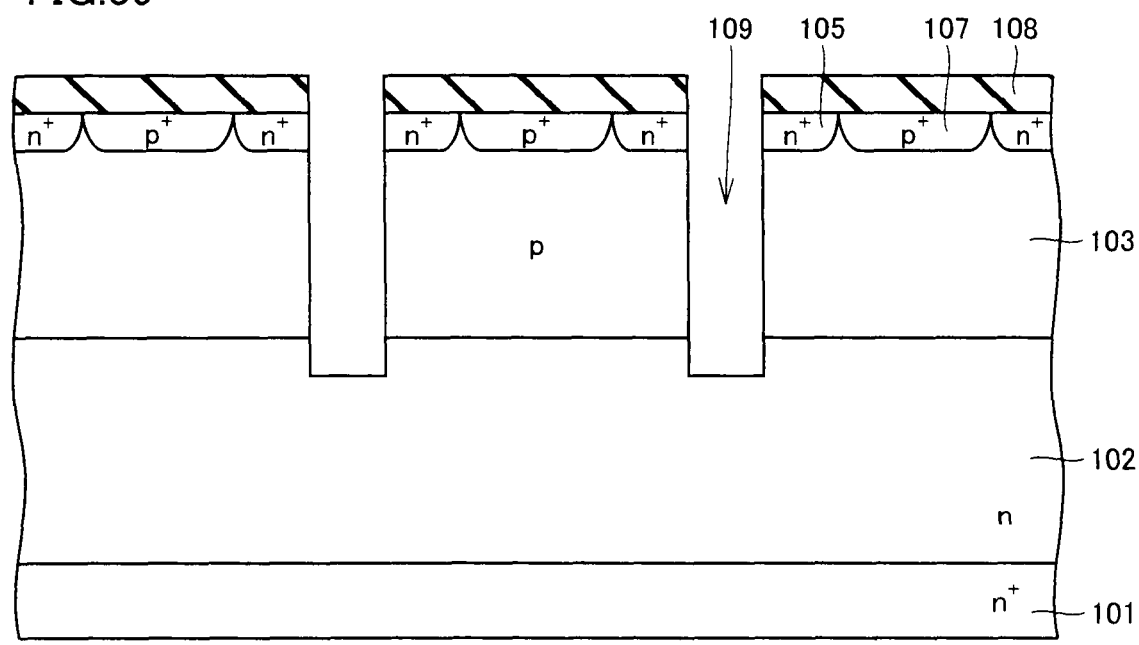
Figure 40:
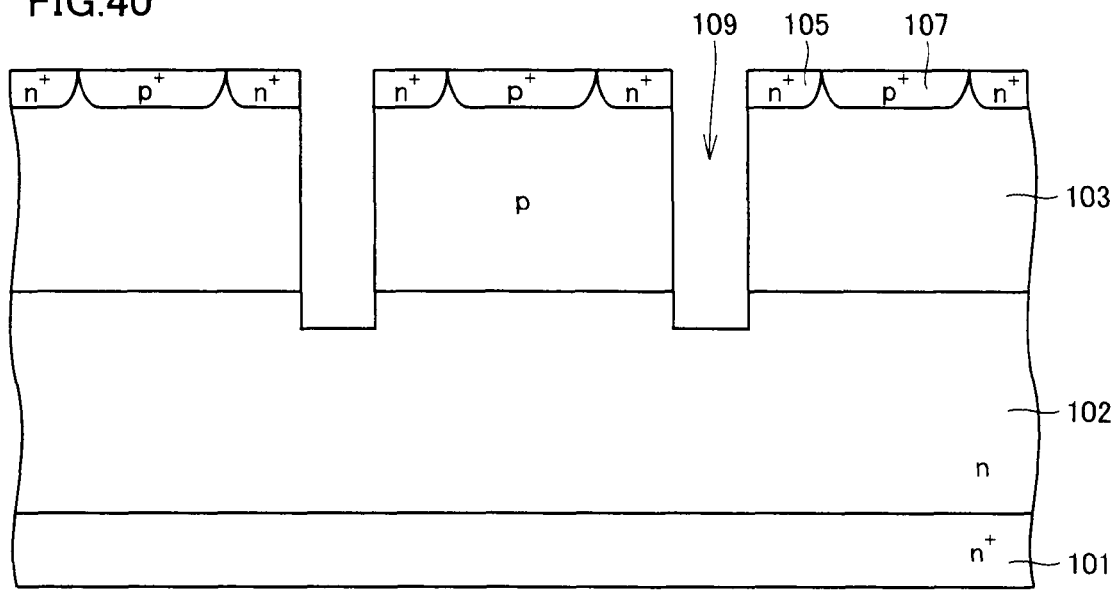
Figure 41:
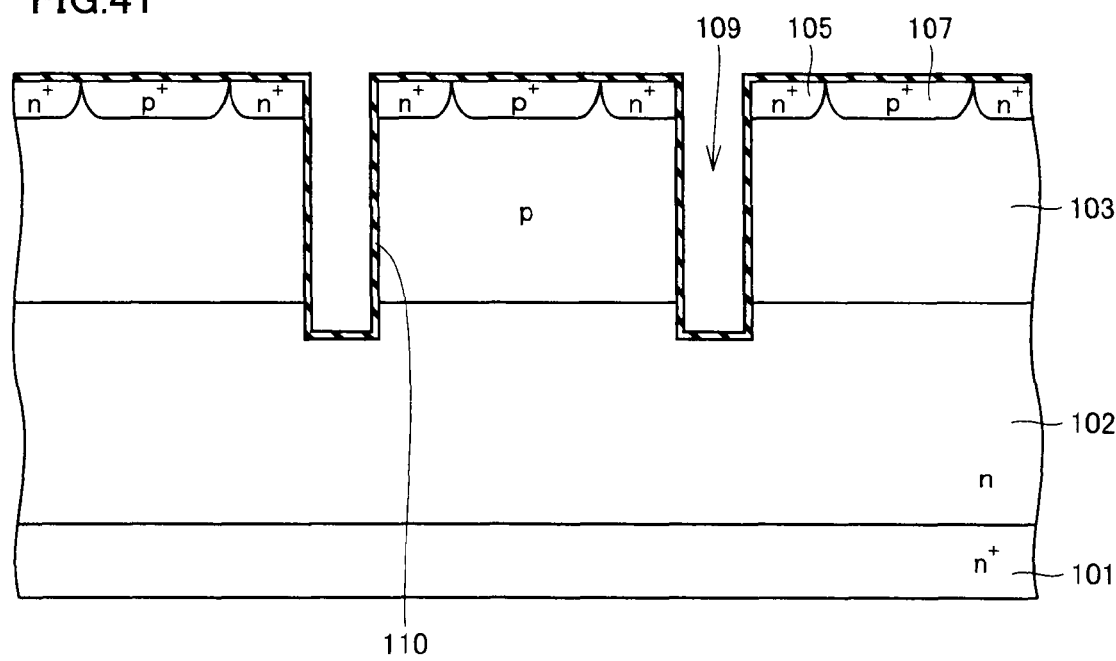
Figure 42:
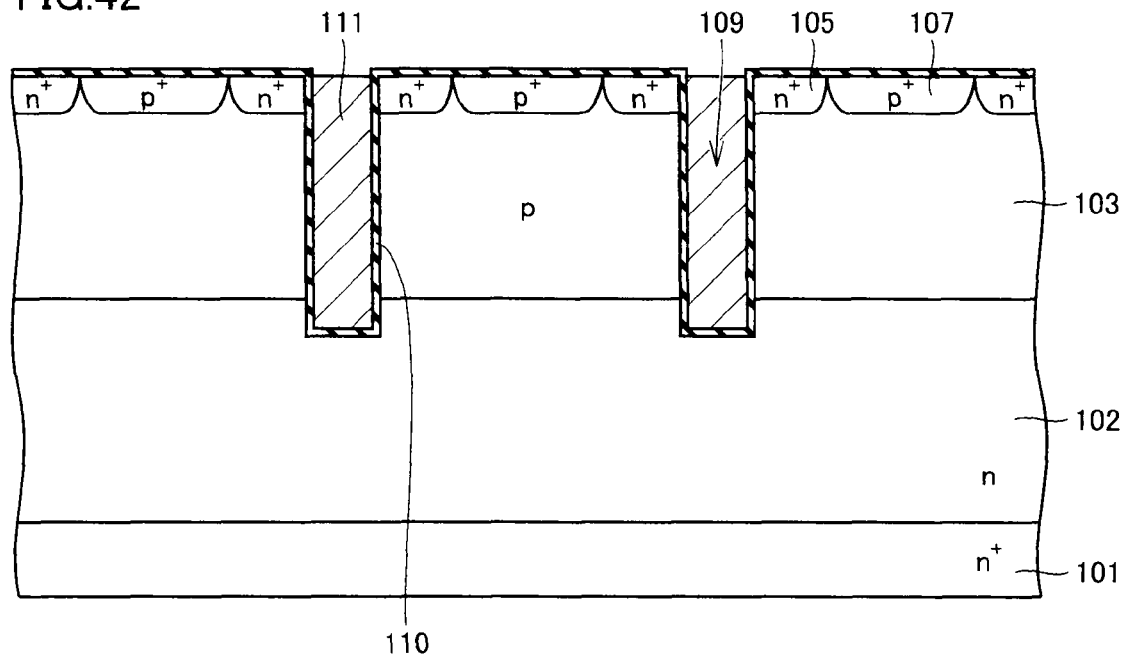
Figure 43:
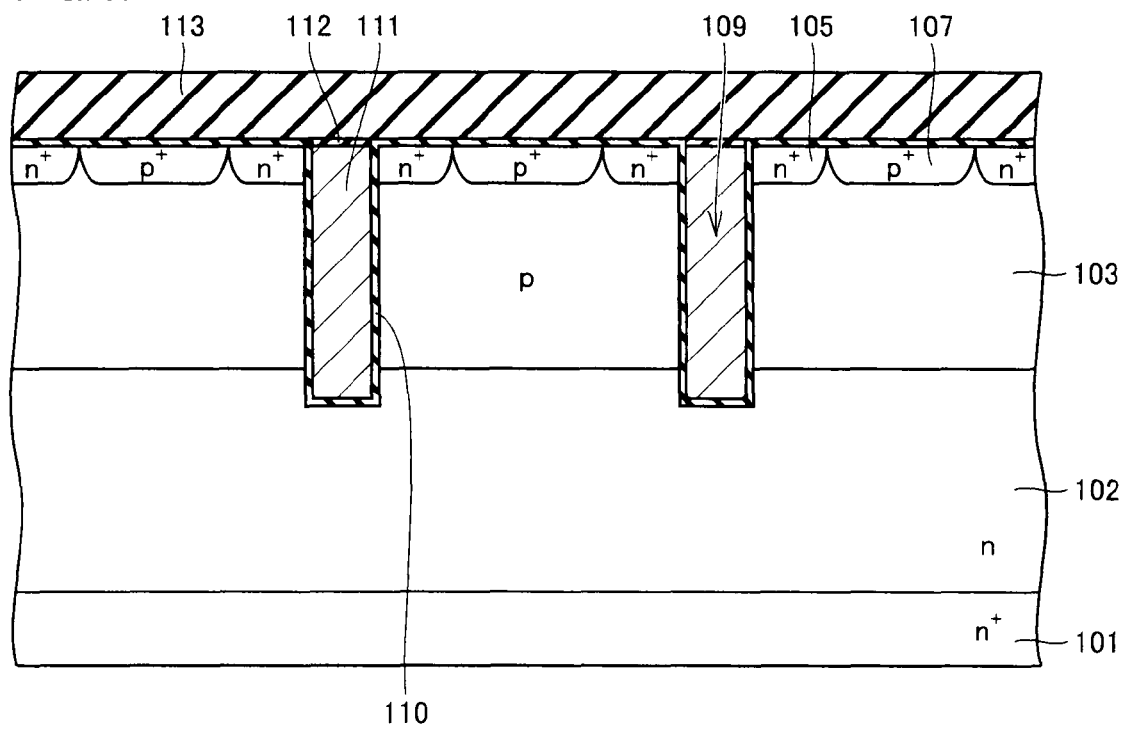
Figure 44:
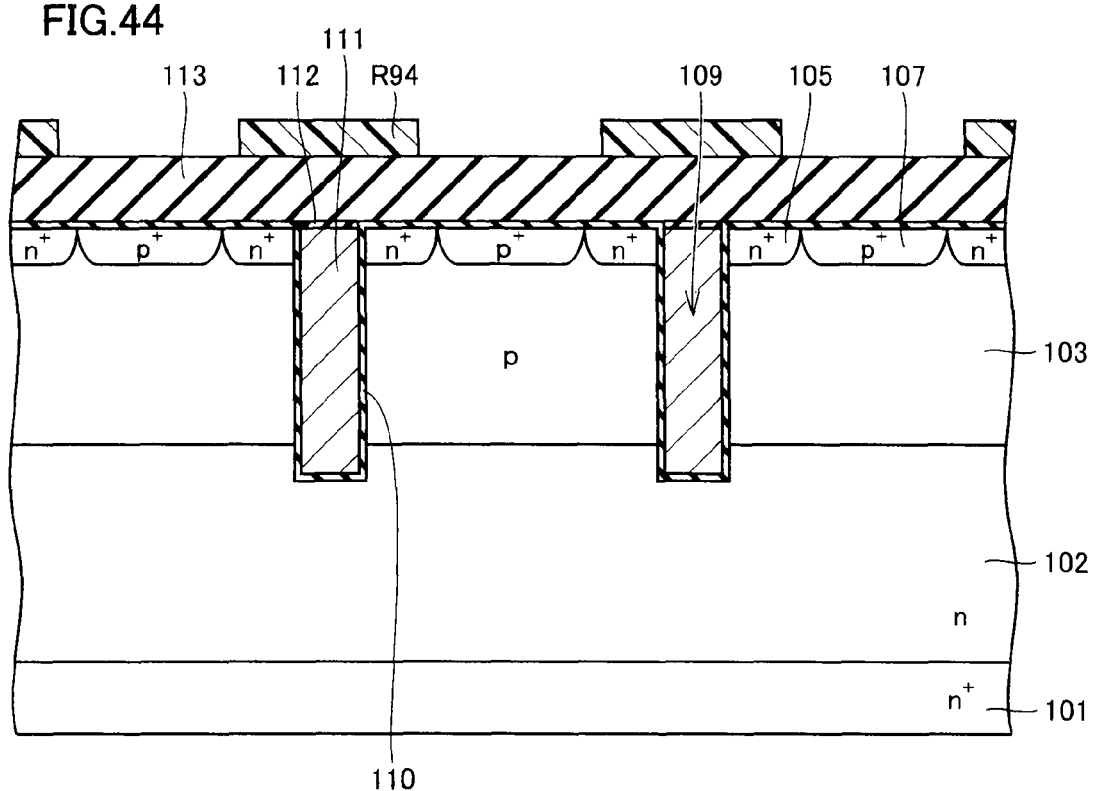
Figure 45:
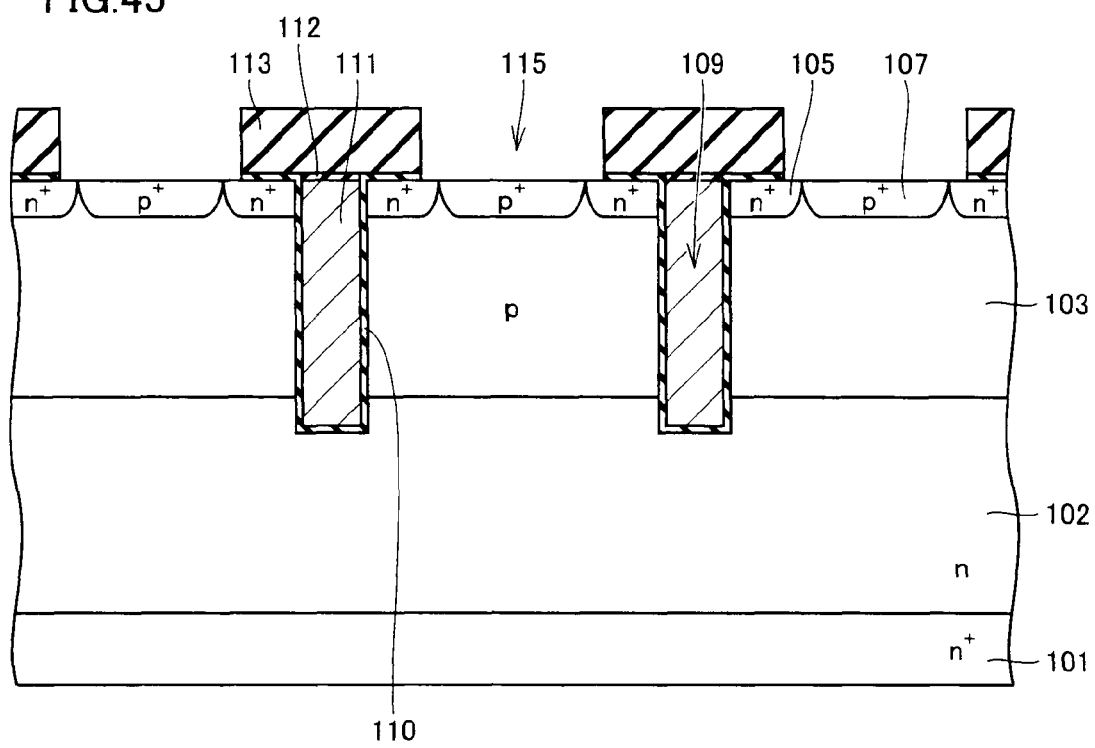
Figure 46:
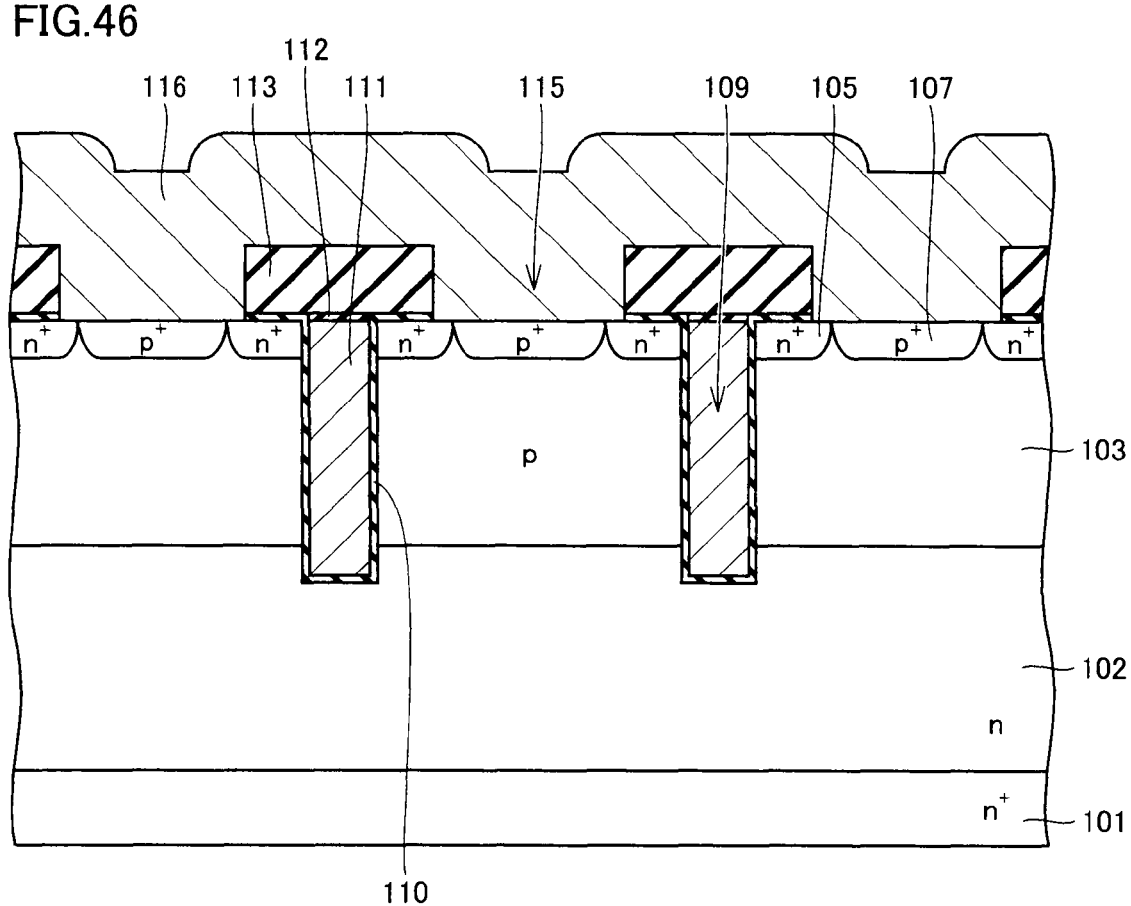

Referring to FIGS. 34-36, a resist pattern R92 is formed on n$^+$ source region 105 by photolithography (FIG. 26: step S94*a*). The mask layer formed of resist pattern R92 is used to implant boron (B) ions (FIG. 26: step S94*b*). After resist pattern R92 is removed, the implanted boron is diffused by drive-in (FIG. 26: step S94*c*), with the result that p$^+$ contact region 107 is formed.

Then, a trench gate 111 (FIG. 47) is formed (FIG. 23: step S95). Specifically, the following processes are carried out.

Figure 27:
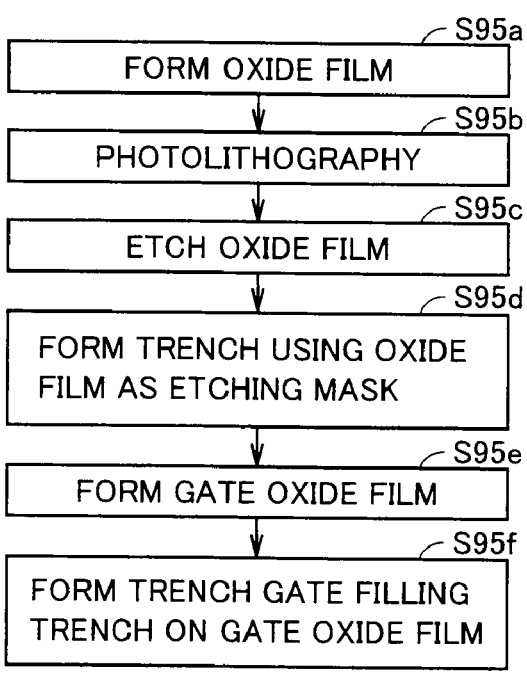
FIG. 27 is a flowchart illustrating a process of forming a trench gate in FIG. 23.

Referring to FIGS. 37-42, an oxide film 108 covering upper and front surfaces is formed (FIG. 27: step S95*a*). A resist pattern R93 is formed on oxide film 108 by photolithography (FIG. 27: step S95*b*). Resist pattern R93 is used as a mask to etch oxide film 108 (FIG. 27: step S95*c*), causing oxide film 108 to be patterned. Then, as this patterned oxide film 108 is used as an etching mask to carry out silicon etching, a trench 109 is formed (FIG. 27: step S95*d*). After oxide film 108 is removed, a gate oxide film 110 is formed (FIG. 27: step S95*e*). A conductive polysilicon film is deposited on the entire surface and then etched back. Consequently, the polysilicon film is remained only inside trench 109 to thereby form trench gate 111 filling trench 109 on gate oxide film 110 (FIG. 27: step S95*f*).

Then, a source electrode 116 (FIG. 47) is formed (FIG. 23: step S96). Specifically, the following processes are carried out.

Referring to FIGS. 43-46, an oxide film 113 is formed on the entire upper surface. A resist pattern R94 having an opening corresponding to a source contact 115 (FIG. 47) is formed on oxide film 113 by photolithography. Then, resist pattern R94 is used as a mask to etch oxide film 113, causing source contact 115 to be formed. Source electrode 116 is then formed.

Figure 47:
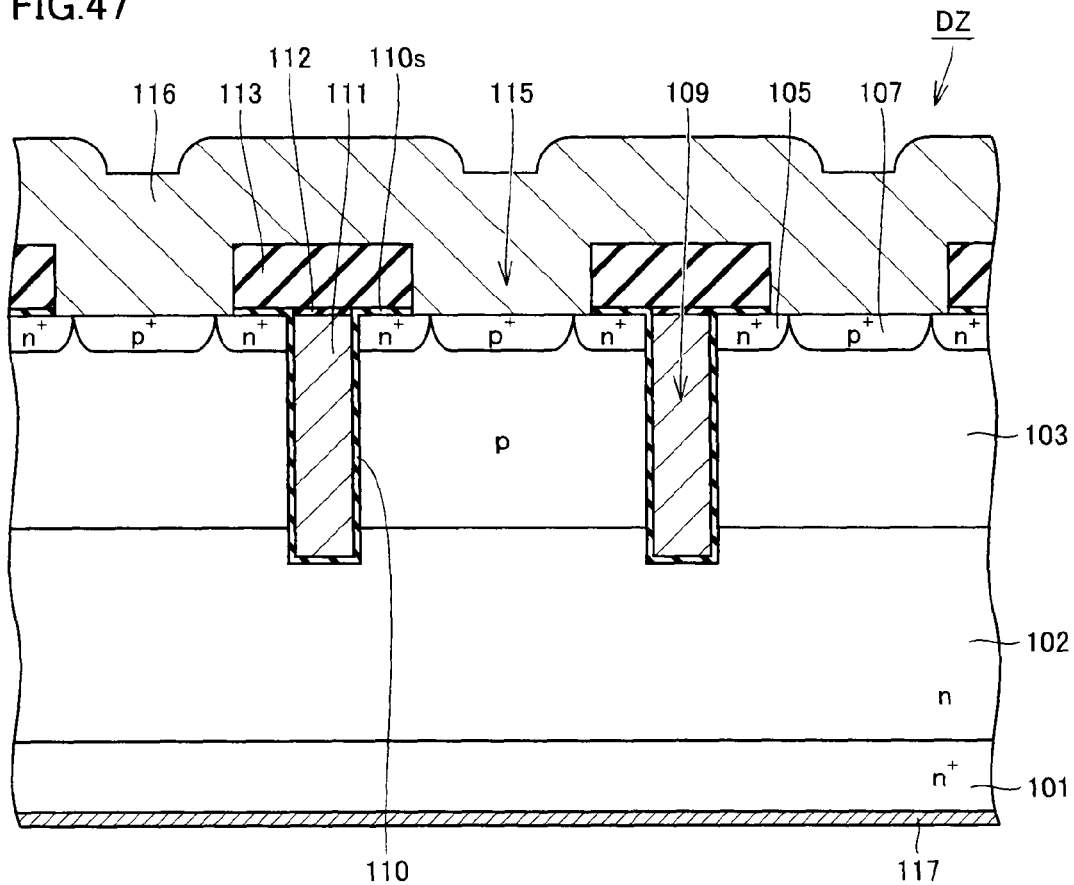

Referring to FIG. 47, a drain electrode 117 is formed on the rear surface (underside surface in FIG. 47) of n$^+$ layer 101 (FIG. 23: step S97). Consequently, power semiconductor device DZ as a comparative example is obtained.

In the above-described comparative example, a total of at least five photolithography processes including the photolithography corresponding to step S92*a* (FIG. 24) and the photolithography corresponding to each of resist patterns R91-R94 are carried out. In contrast, the present embodiment only requires two photolithography processes corresponding to first resist pattern R11 (FIG. 6) and second resist pattern R12 (FIG. 20) to be performed. In other words, according to the present embodiment, three photolithography processes can be eliminated, which results in simplification of a method of manufacturing the power semiconductor device.

Furthermore, in the above-described comparative example, photolithography should be carried out with high accuracy in order to sufficiently reduce the misalignment between resist patterns R91-R93. On the other hand, according to the present embodiment, based on the pattern formed by first resist pattern R11, the process of forming each of p+ contact region 6, n+ source region 7 and trench 10 is carried out using the self-alignment technique. Thus, according to the present embodiment, highly accurate alignment is not required in the photolithography process, which results in simplification of the method of manufacturing the power semiconductor device.

Also in the above-described comparative example, an independent process for forming p+ contact region 107 is required (FIG. 23: step S94). On the other hand, according to the present embodiment, the process of forming p base region 5 (FIG. 2: step S13) causes formation of p+ contact region 6. Consequently, the method of manufacturing the power semiconductor device is simplified.

Figure 48:
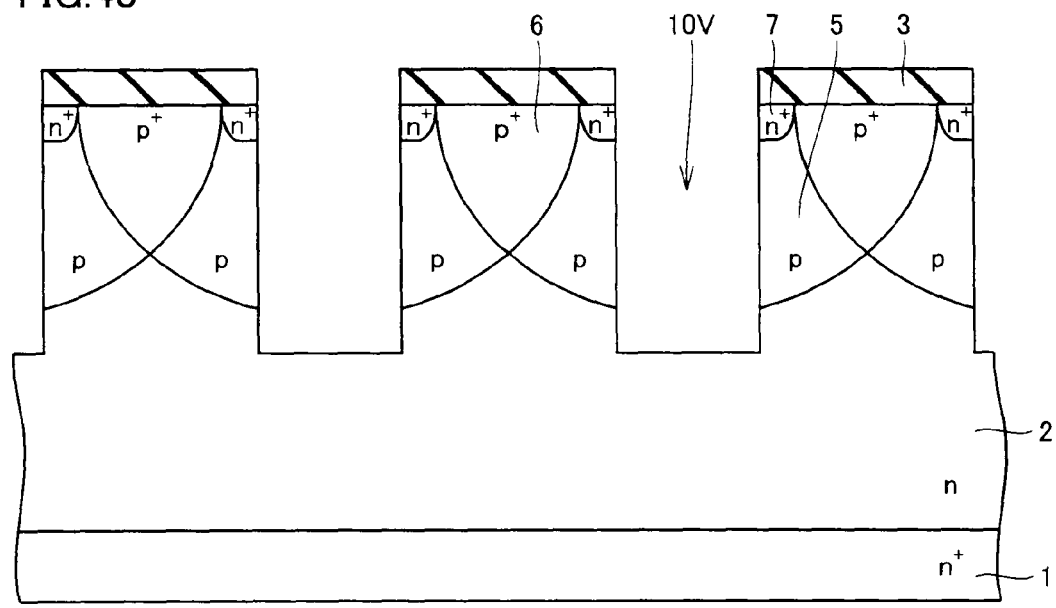
FIG. 48 is a partial cross-sectional view schematically showing a process of the method of manufacturing the power semiconductor device in a first modification according to the first embodiment of the present invention.

Although, in the present embodiment, sidewall oxide film 9 (FIG. 14) is formed in accordance with step S15a (FIG. 3), formation of sidewall oxide film 9 may be eliminated for further simplifying the manufacturing method. In this case, since the etching mask does not include sidewall oxide film 9 (FIG. 14), a trench 10V (FIG. 48) formed by this etching mask is greater in width than trench 10 (FIG. 15).

Furthermore, power semiconductor device D1 (FIG. 1) according to the present embodiment includes p+ contact region 6. The boron concentration for imparting a p-type to p+ contact region 6 is higher at its surface side (upper surface side in FIG. 10) than that of p base region 5. Thus, the portion at the surface side of p+ contact region 6 having a higher boron concentration is brought into contact with source electrode 17 (FIG. 1), allowing a further ohmic connection therebetween. The design dimension requirements for forming p+ contact region 6 with more reliability will be hereinafter described.

Figure 49:
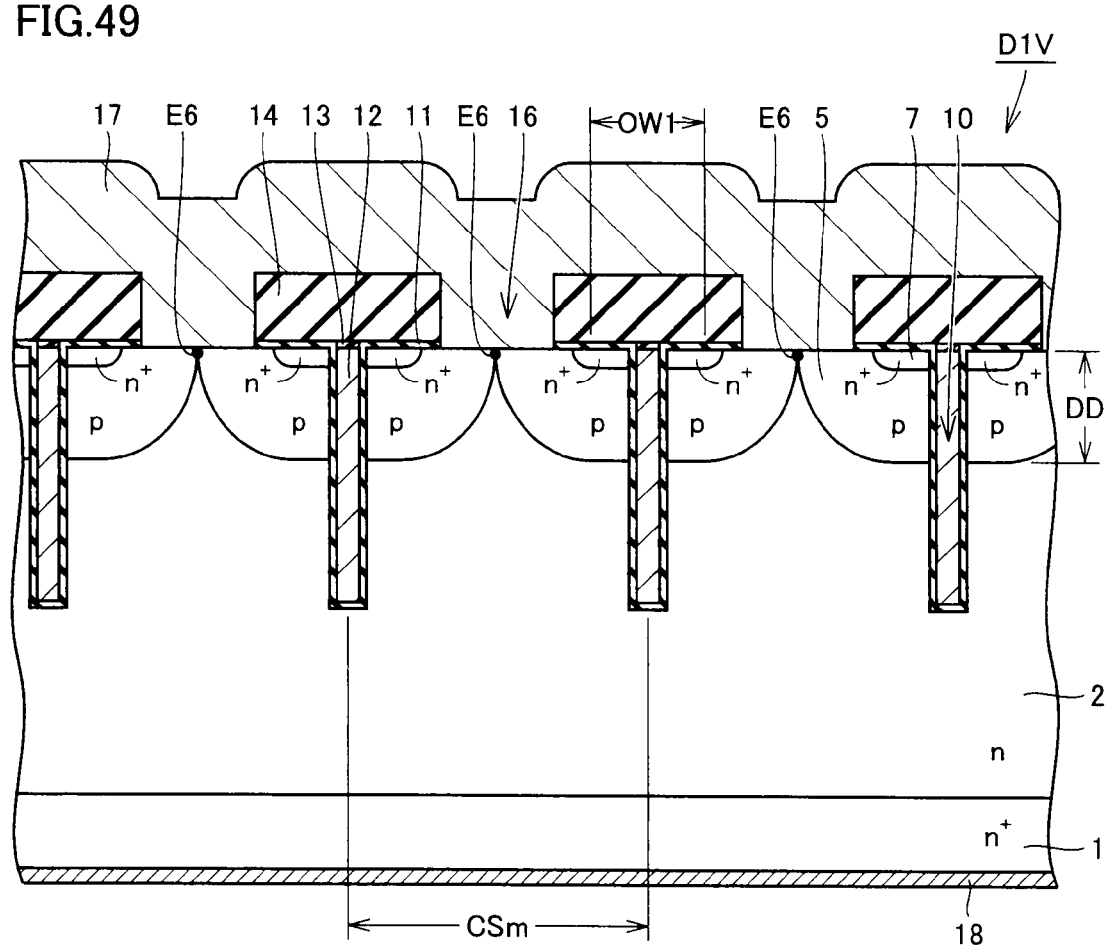
FIG. 49 is a partial cross-sectional view schematically showing the configuration of the power semiconductor device in a second modification according to the first embodiment of the present invention.

Referring to FIG. 49, a power semiconductor device D1V which is a modification of power semiconductor device D1 according to the present embodiment has a cell size CSm instead of cell size CS1 (FIG. 6) of the present embodiment. Cell size CSm is equal to a sum of a value twice the value of 0.8 times of the diffusion depth of p base region 5, that is, a value of 1.6 times of the diffusion depth of p base region 5 and opening width OW1 (FIG. 6). For example, in the case where opening width OW1 is 3 μm and the diffusion depth of p base region 5 is 3 μm, cell size CSm is assumed to be about 8 μm.

In the case where cell size CSm is set as described above, adjacent p base regions 5 come into contact with each other at a contact E6 and p+ contact region 6 (FIG. 1) is not formed. Accordingly, as cell size CS1 is set to be smaller than cell size CSm, p+ contact region 6 can be formed with more reliability.

Second Embodiment

Figure 50:
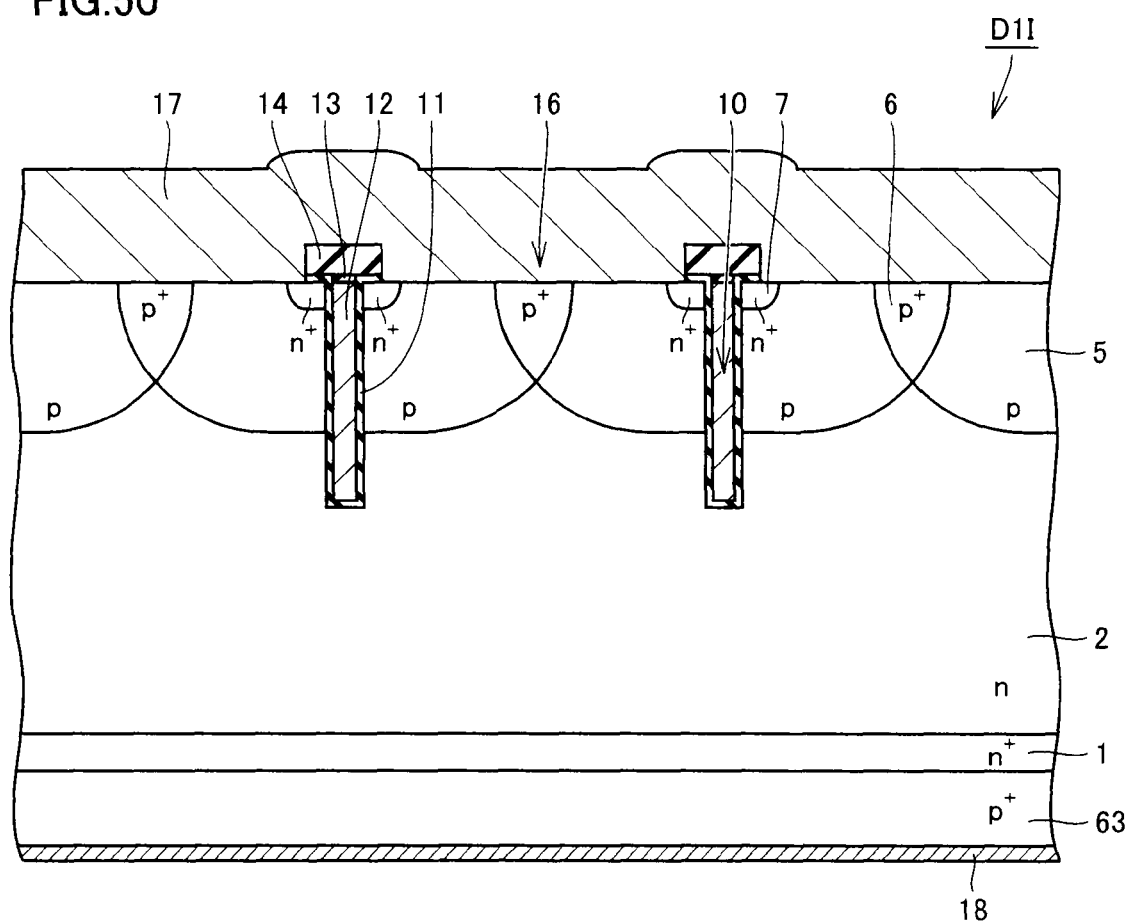
FIG. 50 is a partial cross-sectional view schematically showing the configuration of the power semiconductor device according to the second embodiment of the present invention.

Referring to FIG. 50, a power semiconductor device D1I according to the present embodiment serves as an IGBT having a trench gate structure and has a p+ semiconductor region 63 between drain electrode 18 and n+ layer 1 in power semiconductor device D1 (FIG. 1). P+ semiconductor region 63 having a p-type is provided as a collector layer of the IGBT. Furthermore, source electrode 17, drain electrode 18 and n+ source region 7 serve as an emitter electrode, a collector electrode and an n+ emitter region, respectively, in the present embodiment.

It is to be noted that since the configurations other than those described above are almost the same as the configuration according to the first embodiment described above, the same or corresponding components are designated by the same reference characters, and description thereof will not be repeated.

Power semiconductor device D1I is obtained by adding the process of forming p+ semiconductor region 63 on the rear surface (the other main surface) of wafer WF1 (FIG. 4) before forming drain electrode 18 to the manufacturing method according to the first embodiment as described above.

Alternatively, power semiconductor device D1I may be obtained also by using, instead of wafer WF1 (FIG. 4), a wafer (semiconductor substrate) having p+ semiconductor region 63, n+ layer 1 and n layer 2 stacked in this order in the manufacturing method according to the first embodiment as described above. In other words, power semiconductor device D1I may be obtained also by using, instead of wafer WF1 (FIG. 4), a wafer having n layer 2 located at the side of the upper surface (one main surface), p+ semiconductor region 63 located at the side of the rear surface (the other main surface), and n+ layer 1 disposed between n layer 2 and p+ semiconductor region 63. This wafer is obtained, for example, by epitaxially growing silicon on the silicon substrate as p+ semiconductor region 63 to form n+ layer 1 and n layer 2.

According to the present embodiment, in the case where the power semiconductor device is an IGBT, the same effects as those obtained in the first embodiment can be achieved.

Third Embodiment

Figure 51:
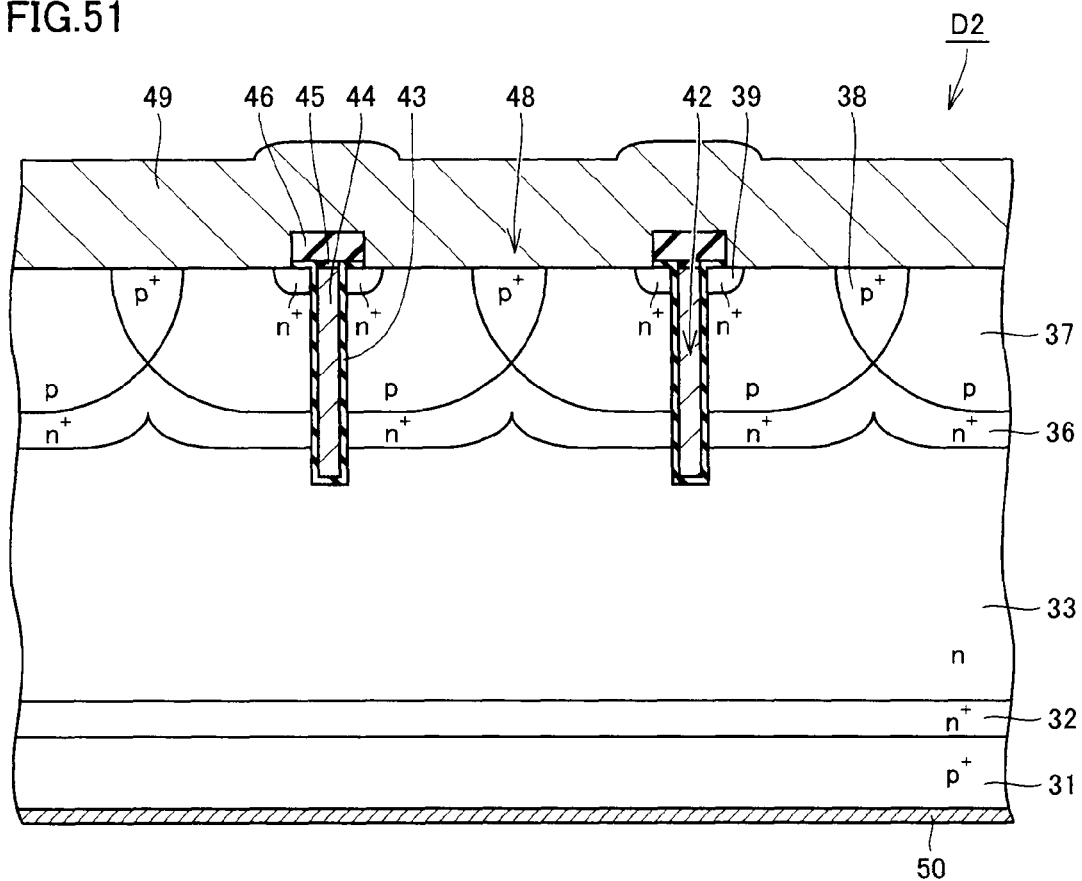
FIG. 51 is a partial cross-sectional view schematically showing the configuration of the power semiconductor device according to the third embodiment of the present invention.

Referring to FIG. 51, a power semiconductor device D2 according to the present embodiment serves as a carrier-accumulation-type IGBT having a trench gate structure. This power semiconductor device D2 includes a p+ semiconductor region 31, an n+ layer 32, an n layer 33, an n+ carrier accumulation layer 36, a p base region 37, a p+ contact region 38 (high concentration region), an n+ emitter region 39, a gate oxide film 43 (gate insulation film), a trench gate 44, oxide films 45 and 46, an emitter electrode 49, and a collector electrode 50.

N+ layer 32, n layer 33, n+ carrier accumulation layer 36, and n+ emitter region 39 each are made of an n-type (first conductivity type) semiconductor. Furthermore, n+ layer 32, n+ carrier accumulation layer 36 and n+ emitter region 39 are higher in impurity concentration than n layer 33.

P base region 37 and p+ contact region 38 each are made of a p-type (a second conductivity type different from the first conductivity type) semiconductor. P+ contact region 38 is higher in impurity concentration at its upper surface side (side facing emitter electrode 49) than p base region 37.

Emitter electrode 49 is provided in an emitter contact 48 formed to extend through oxide film 46 so as to contact p+ contact region 38 and n+ emitter region 39. Collector electrode 50 is provided on the rear surface (underside surface in FIG. 51) of p+ semiconductor region 31.

The method of manufacturing power semiconductor device D2 will then be described.

Figure 52:
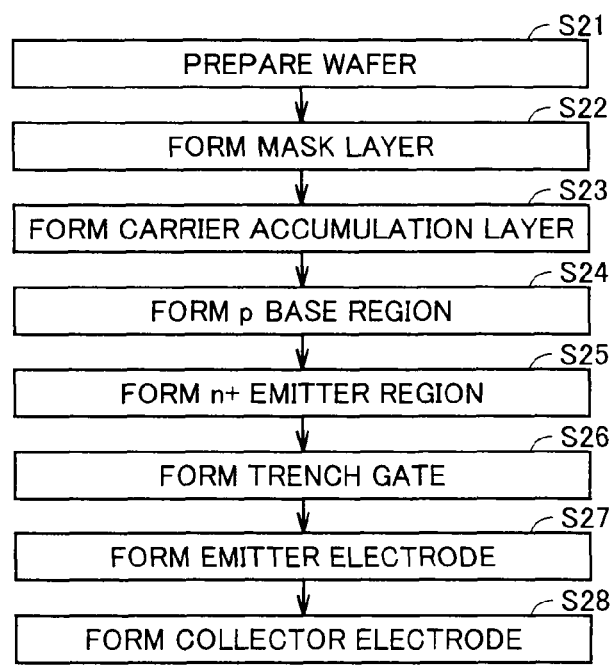
FIG. 52 is a flowchart illustrating a method of manufacturing the power semiconductor device according to the third embodiment of the present invention.
Figure 54:
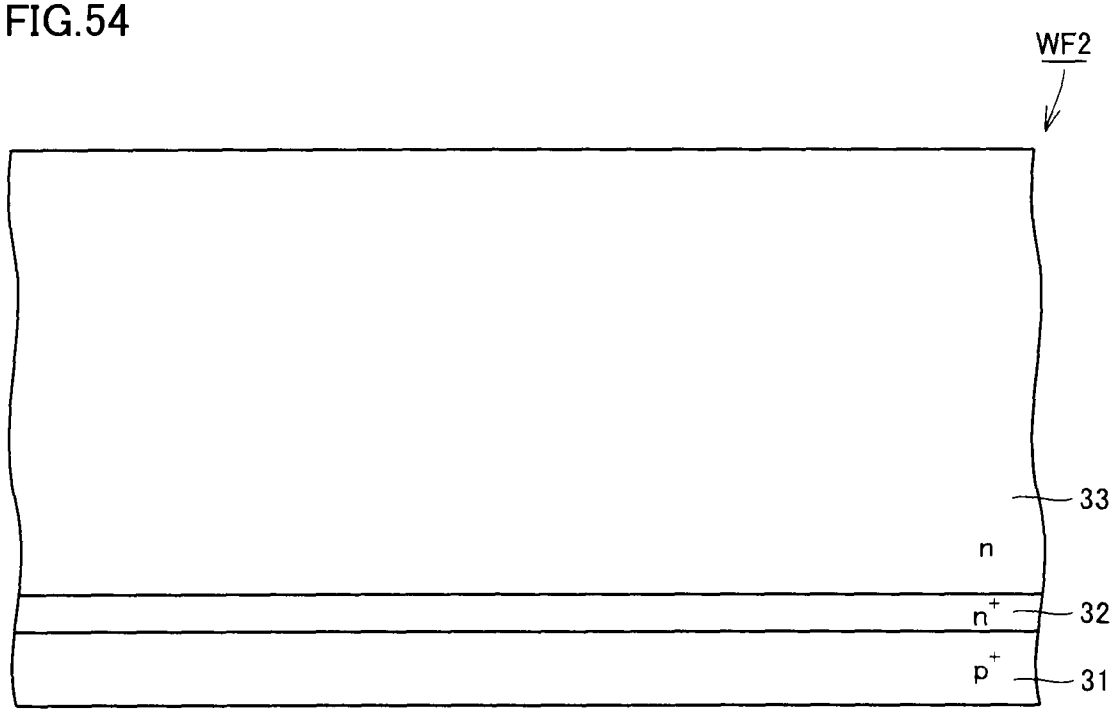
FIGS. 54-74 are partial cross-sectional views schematically showing the first to twenty-first processes, respectively, of the method of manufacturing the power semiconductor device according to the third embodiment of the present invention.

Referring to FIG. 54, a wafer WF2 (semiconductor substrate) having an upper surface (one main surface) and a rear surface (the other main surface) is first prepared (FIG. 52: step S21). Wafer WF2 includes p+ semiconductor region 31, n+ layer 32 and n layer 33 (the first layer). P+ semiconductor region 31 is made of a p-type semiconductor having a high concentration. N layer 33 is made of an n-type semiconductor which is lower in concentration than n+ layer 32. N layer 33 and p+ semiconductor region 31 are located at the side of each of the upper surface and the underside surface of wafer WF2, respectively. For example, wafer WF2 is formed by epitaxially growing silicon on the silicon substrate as p+ semiconductor region 31.

An oxide film 34 (FIG. 57) having a plurality of openings is then formed as a mask layer (FIG. 52: step S22). Specifically, the following processes are carried out.

Figure 55:
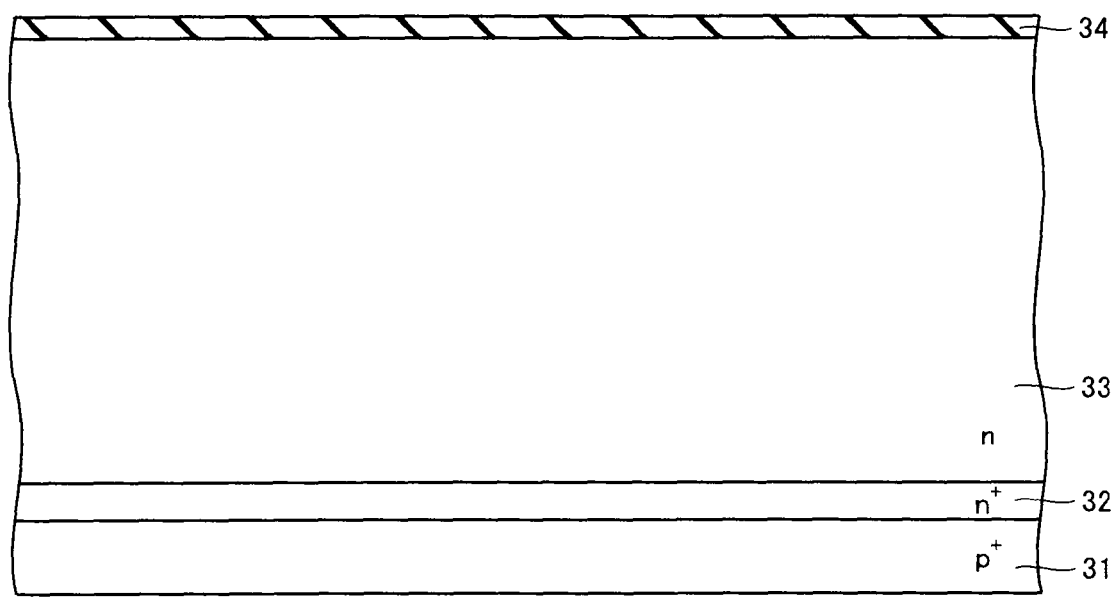

Referring to FIG. 55, oxide film 34 is formed on n layer 33. Oxide film 34 has a film thickness of, for example, 0.5 μm.

Figure 56:
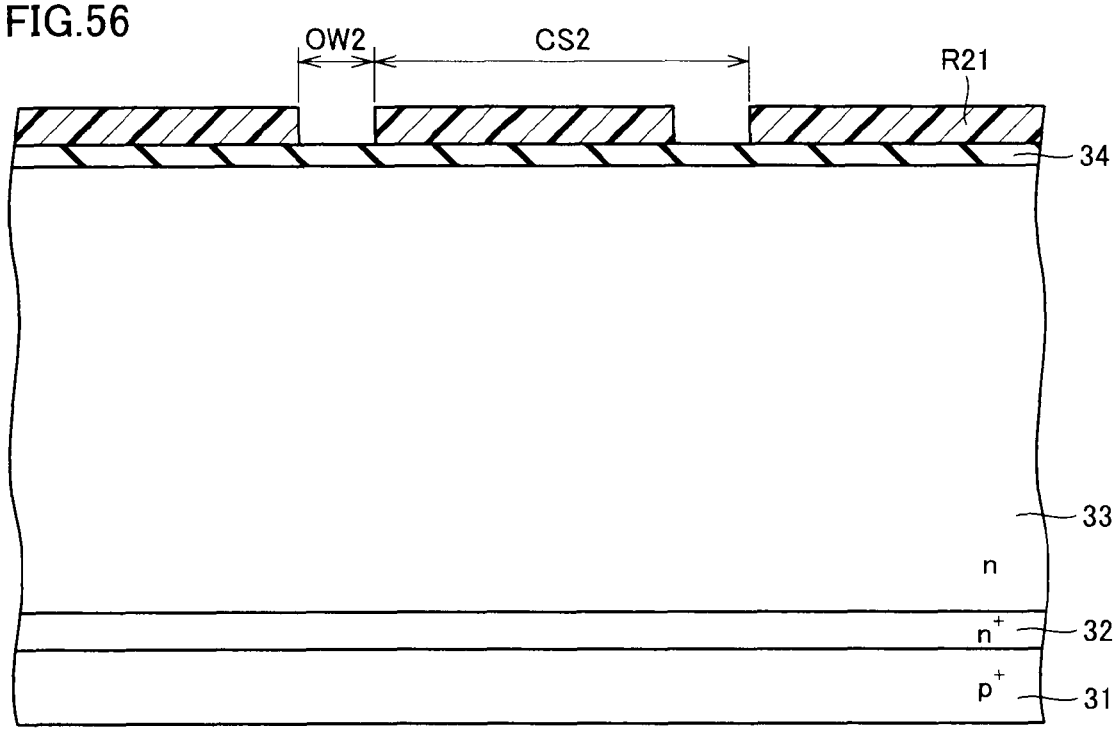

Referring to FIG. 56, a first resist pattern R21 is formed on oxide film 34 by photolithography. First resist pattern R21 has a plurality of openings which are arranged at a pitch equal to a cell size CS2 in one direction (in the lateral direction in FIG. 56). The plurality of openings each have an opening width OW2 in the one direction. For example, cell size CS2 is 10 μm and opening width OW2 is 2 μm. Furthermore, first resist pattern R21 has a film thickness of, for example, 1 μm.

Figure 57:
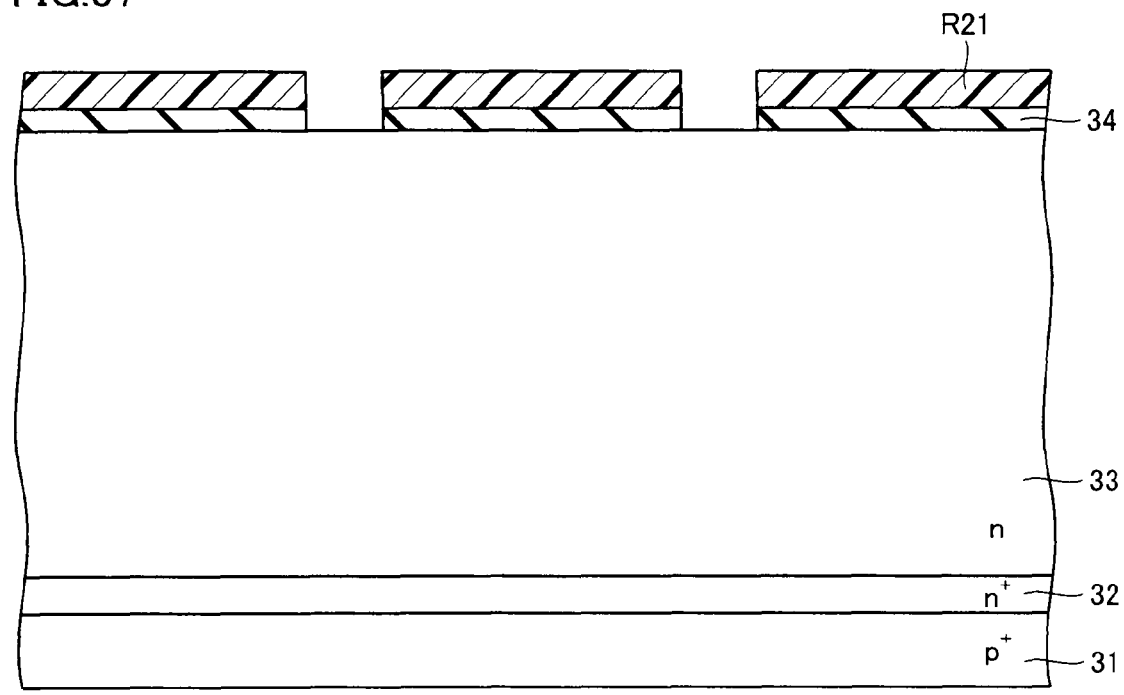

Referring to FIG. 57, oxide film 34 is etched using first resist pattern R21 as a mask.

A mask layer including oxide film 34 is formed by the above-described processes in FIGS. 55-57. Accordingly, the pattern of the mask layer corresponds to that of first resist pattern R21.

$N^+$ carrier accumulation layer 36 is then formed (FIG. 52: step S23). Specifically, the following processes are carried out.

Figure 53:
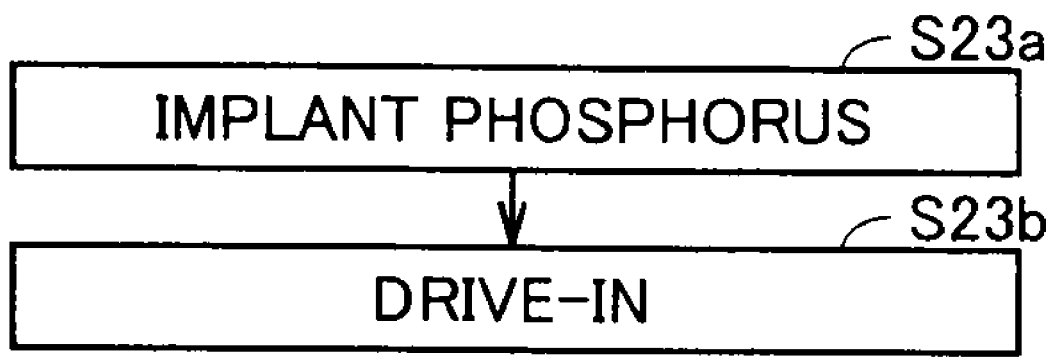
FIG. 53 is a flowchart illustrating the formation of a p base in FIG. 52.
Figure 58:
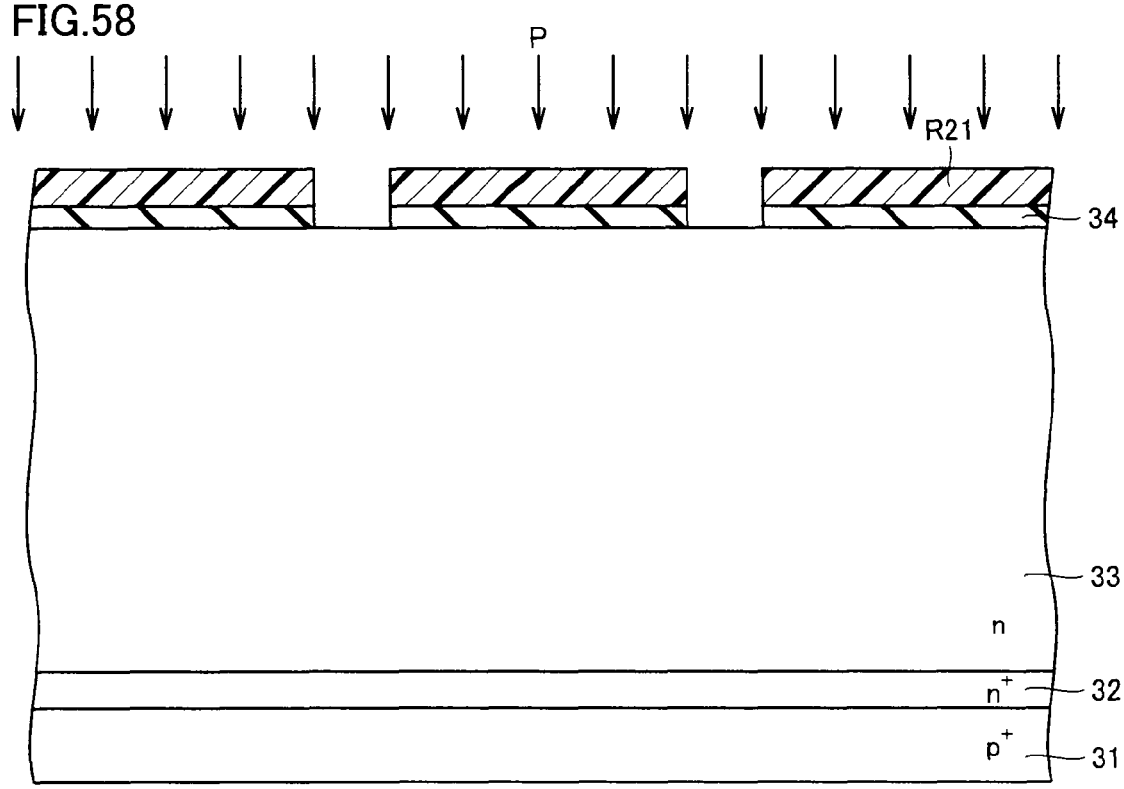

Referring to FIG. 58, the mask layer including oxide film 34 is used to implant phosphorus (P) ions as impurities for imparting an n-type conductivity type (FIG. 53: step S23a). The acceleration energy for the ion implantation is, for example, 150 keV. First resist pattern R21 is then removed.

Figure 59:
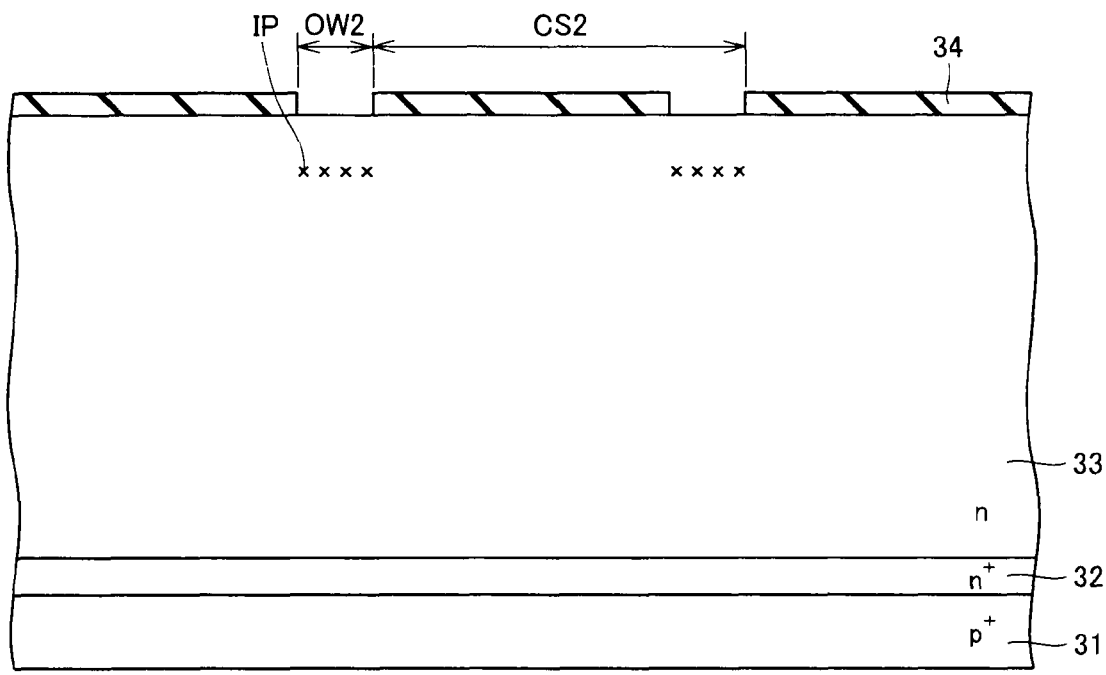
Figure 60:
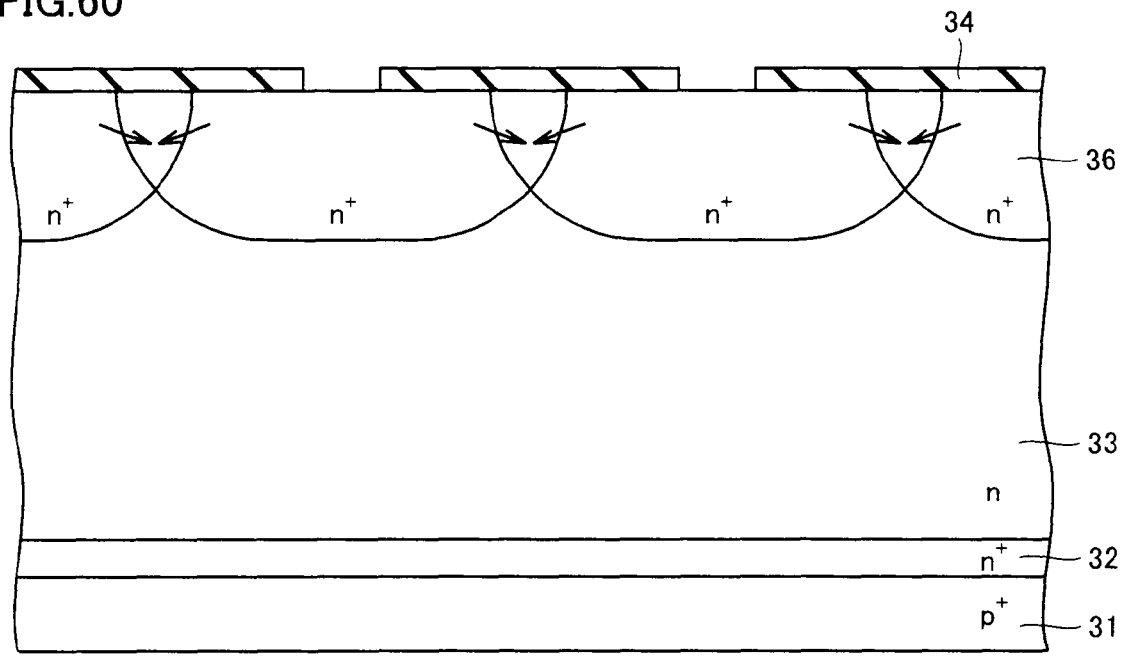

Referring to FIGS. 59 and 60, impurities IP containing the implanted phosphorus are diffused by drive-in (FIG. 53: step S23b).

$N^+$ carrier accumulation layer 36 is formed on n layer 33 by the above-described processes in FIGS. 58-60. For example, $n^+$ carrier accumulation layer 36 has a surface concentration of $1 \times 10^{15}$ cm$^{-3}$ and a diffusion depth DD of 5 μm.

Figure 61:
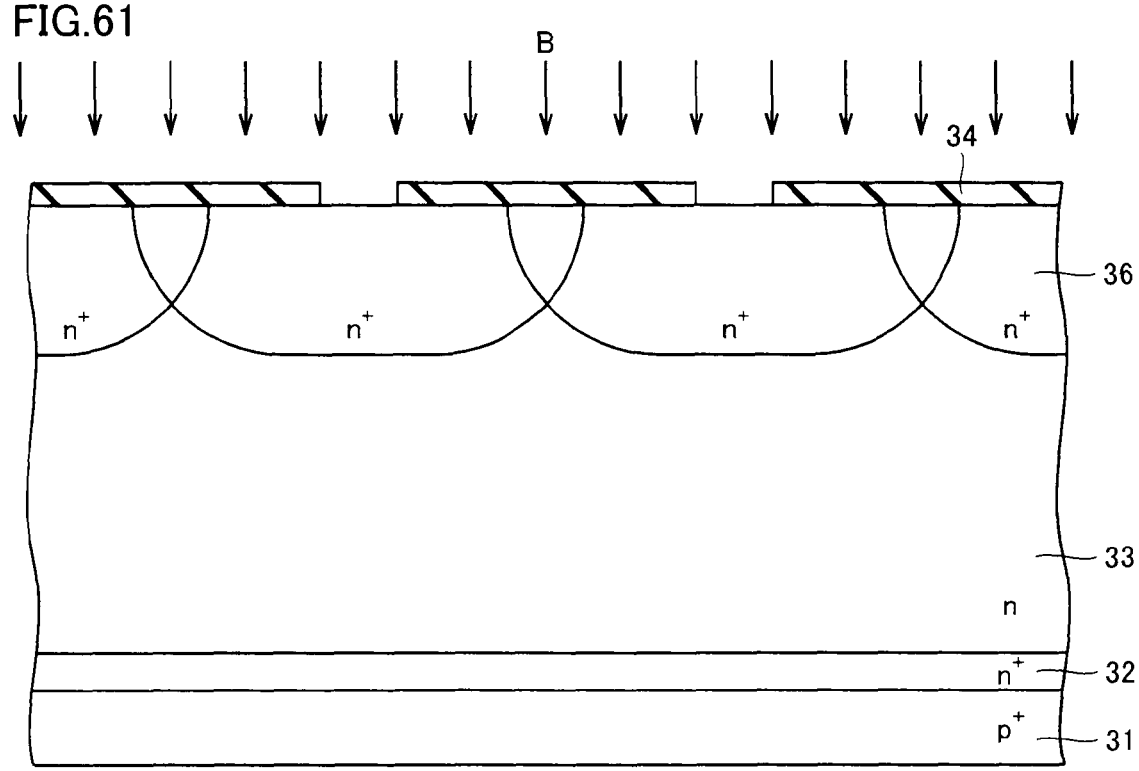

Referring to FIG. 61, the mask layer formed of oxide film 34 is then used to implant boron (B) ions as impurities for imparting a p-type conductivity type.

Figure 62:
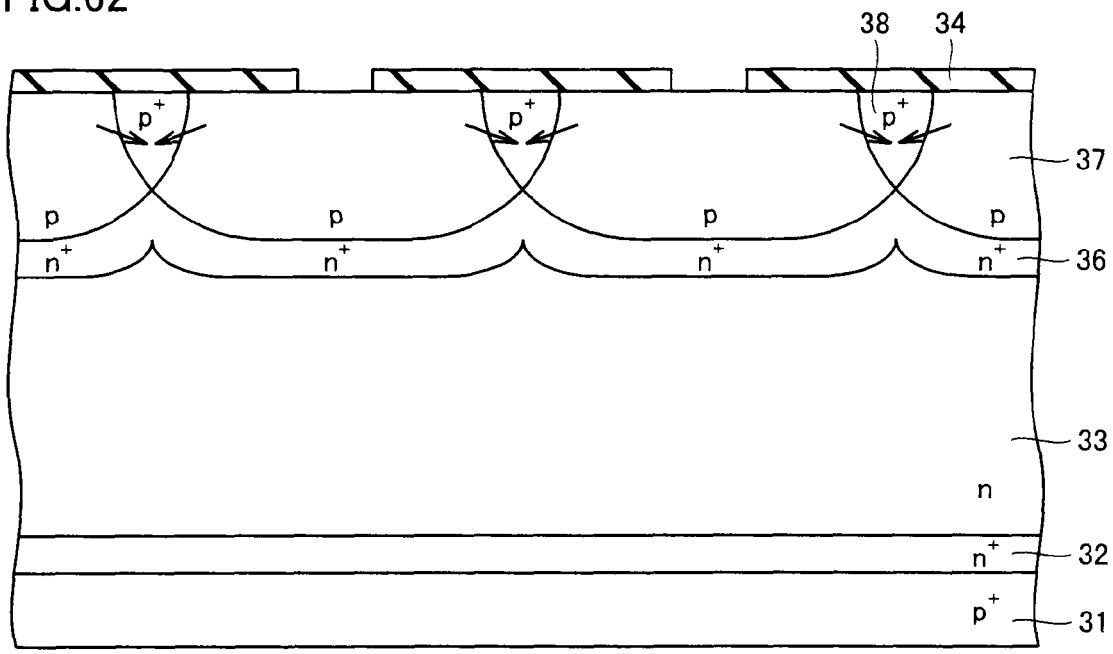

Referring to FIG. 62, the implanted boron is diffused by drive-in. Consequently, p base region 37 (the second layer) is formed in an area on n layer 33 with $n^+$ carrier accumulation layer 36 interposed therebetween and in the opening of oxide film 34 and in proximity thereto in plan view (FIG. 52: step S24).

When forming p base region 37, boron is diffused from each of a pair of openings adjacent to each other among the plurality of openings of oxide film 34 into an area located on n layer 33 with $n^+$ carrier accumulation layer 36 interposed therebetween and covered with oxide film 34. Consequently, $p^+$ contact region 38 is formed in the area on n layer 33 with $n^+$ carrier accumulation layer 36 interposed therebetween and between p base regions 37 adjacent to each other in plan view. In contrast to p base region 37, $p^+$ contact region 38 is a region that is subjected to boron diffusion from both sides (right and left sides in FIG. 62) during drive-in (double diffusion region). This causes $p^+$ contact region 38 (high concentration region) to have a boron concentration (impurity concentration) higher at its surface side (upper surface side in FIG. 62) than that of p base region 37 (the second layer).

For example, p base region 37 has a surface concentration of $1 \times 10^{17}$ to $5 \times 10^{17}$ cm$^{-3}$ and a diffusion depth of 3 μm. Furthermore, $p^+$ contact region 38 has a diffusion depth of, for example, 2 μm.

Figure 63:
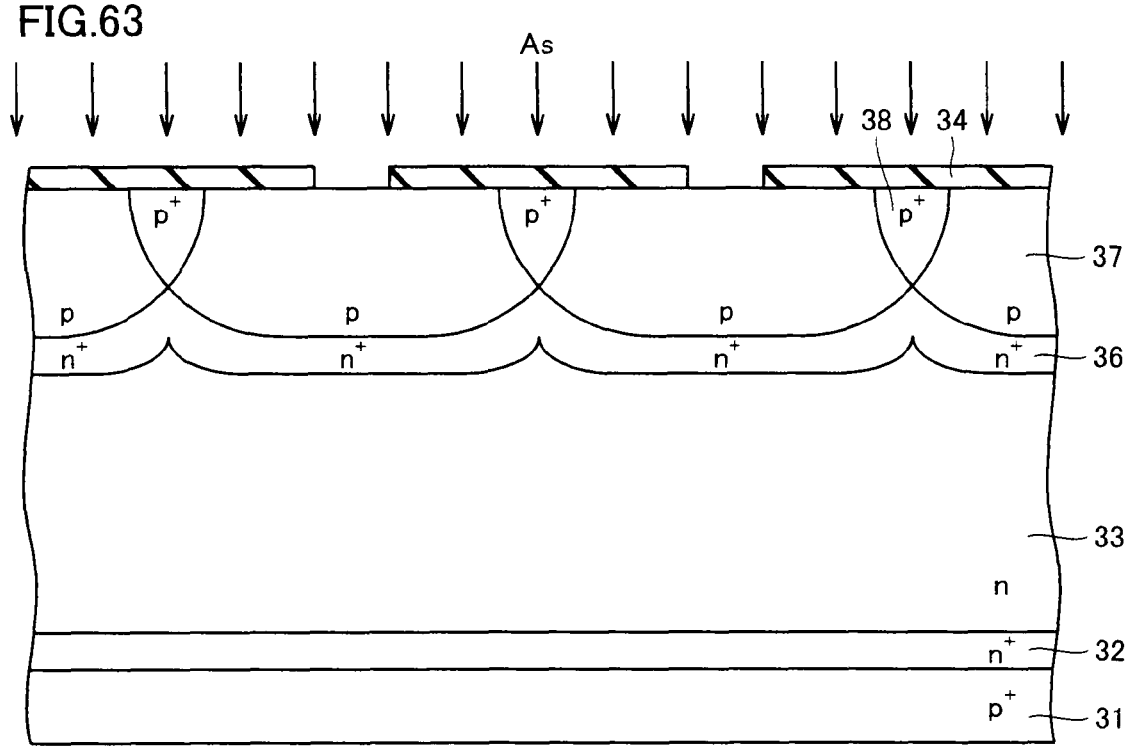

Referring to FIG. 63, the mask layer made of oxide film 34 is used to implant arsenic (As) ions as impurities for imparting an n-type conductivity type.

Figure 64:
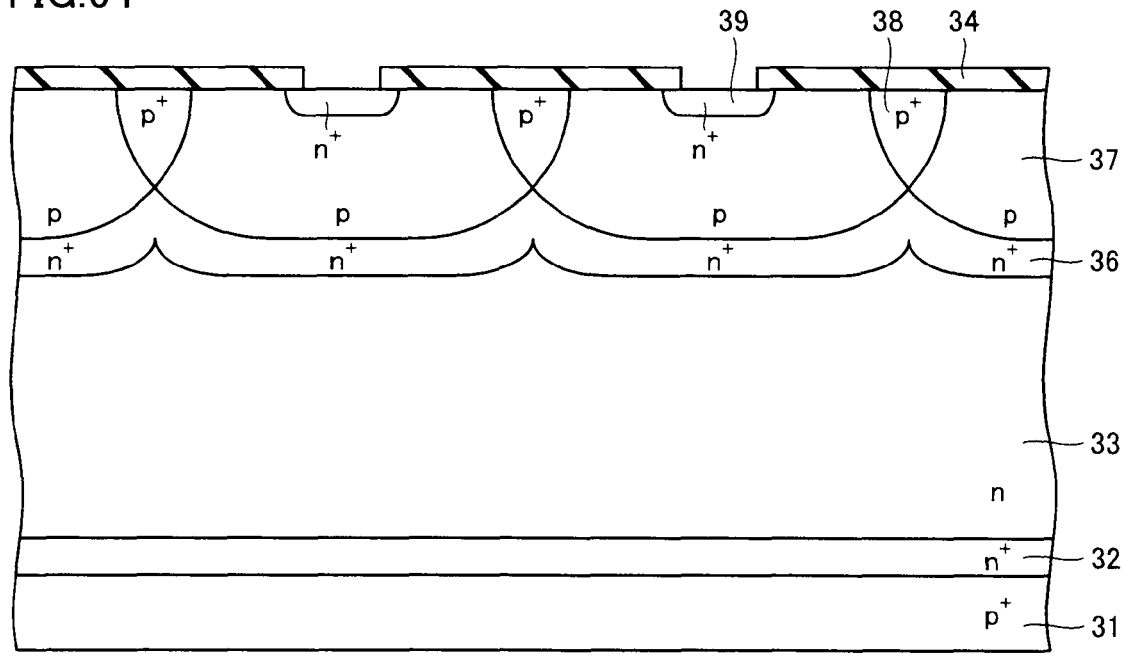

Referring to FIG. 64, the implanted arsenic is diffused by drive-in. Consequently, $n^+$ emitter region 39 (the third layer) is formed in an area on p base region 37 and in the opening of oxide film 34 and in proximity thereto in plan view (FIG. 52: step S25). For example, $n^+$ emitter region 39 has a surface concentration of $1 \times 10^{19}$ to $1 \times 10^{20}$ cm$^{-3}$ and a diffusion depth of 0.5 μm.

Trench gate 44 (FIG. 51) is then formed (FIG. 52: step S26). Specifically, the following processes are carried out as in steps S15a to S15d (FIG. 3) of the first embodiment.

Figure 65:
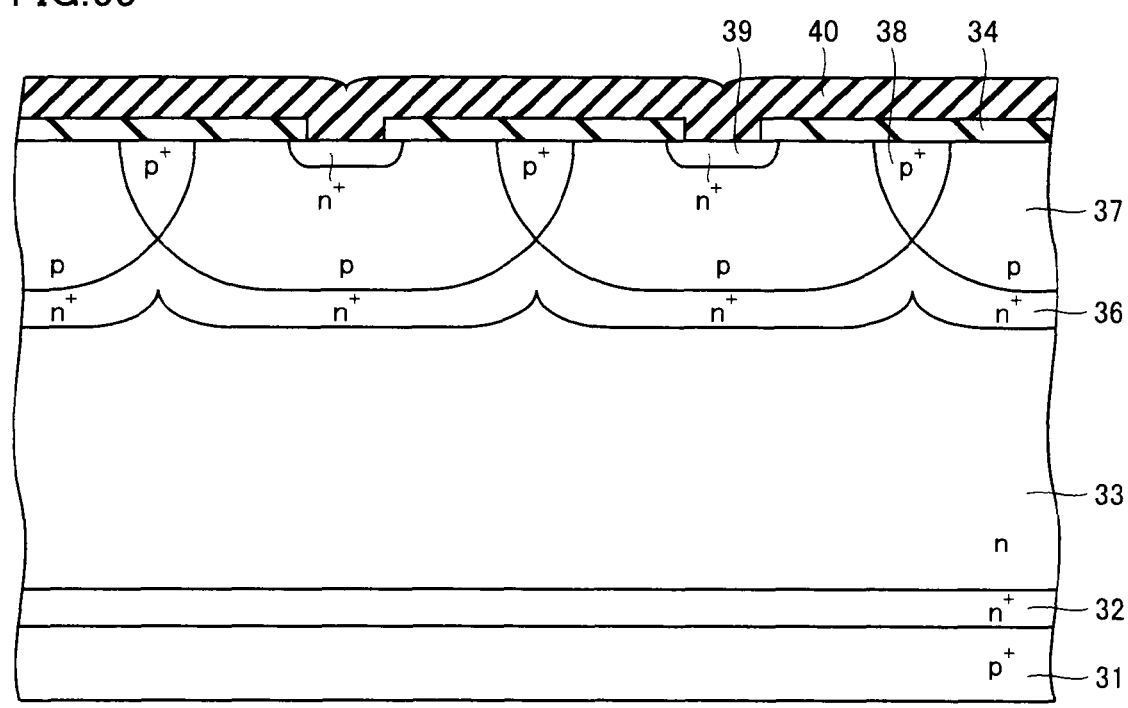
Figure 66:
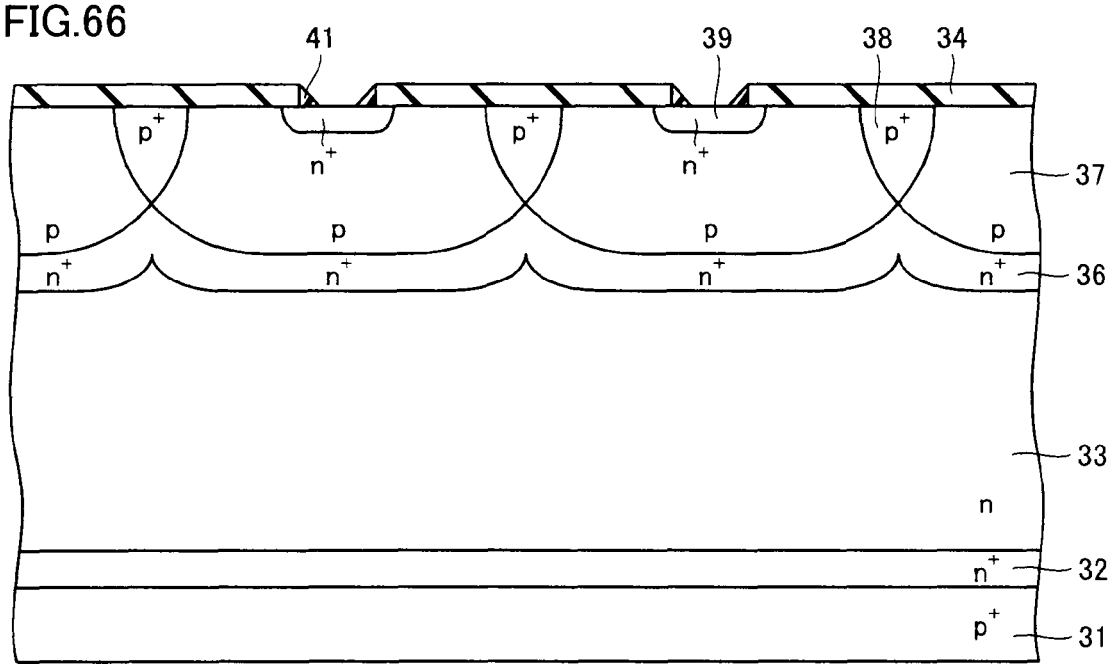

Referring to FIGS. 65 and 66, an oxide film 40 is first formed on the entire upper surface by the CVD method. Oxide film 40 is then etched back by anisotropic dry etching, which causes a portion of oxide film 40 on the sidewall of oxide film 34 to be selectively remained to thereby form a sidewall oxide film 41 (sidewall film) (FIG. 3: step S15a). Sidewall oxide film 41 serves to frame the opening of oxide film 34 to narrow the opening. The width of the opening narrowed by sidewall oxide film 41 is, for example, 1 μm.

Figure 67:
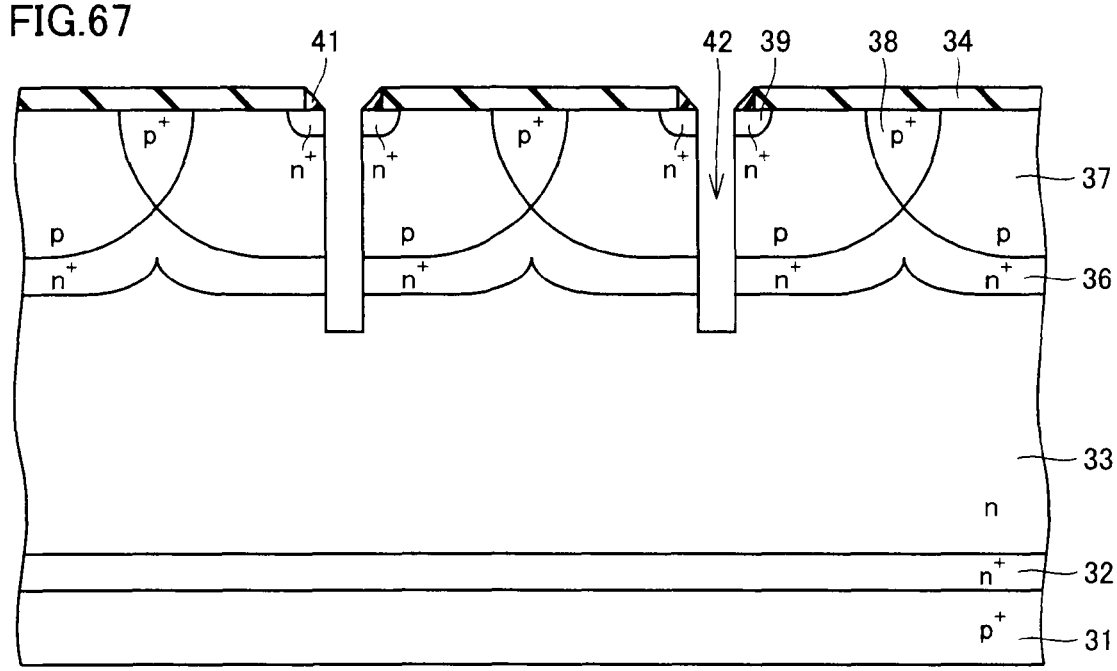
Figure 68:
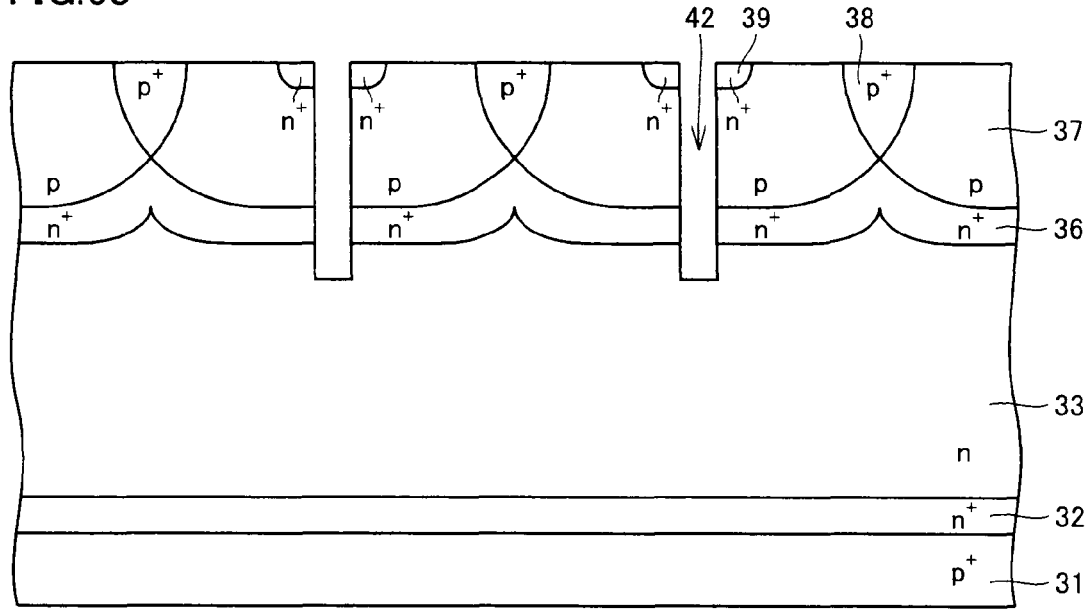

Referring to FIGS. 67 and 68, the etching mask made of oxide film 34 and sidewall oxide film 41 is used to form a trench 41 extending through $n^+$ emitter region 39, p base region 37 and $n^+$ carrier accumulation layer 36 to n layer 33 (FIG. 3: step S15b). Trench 42 has a depth of, for example, 6 μm.

Oxide film 34 and sidewall oxide film 41 are then removed.

Figure 69:
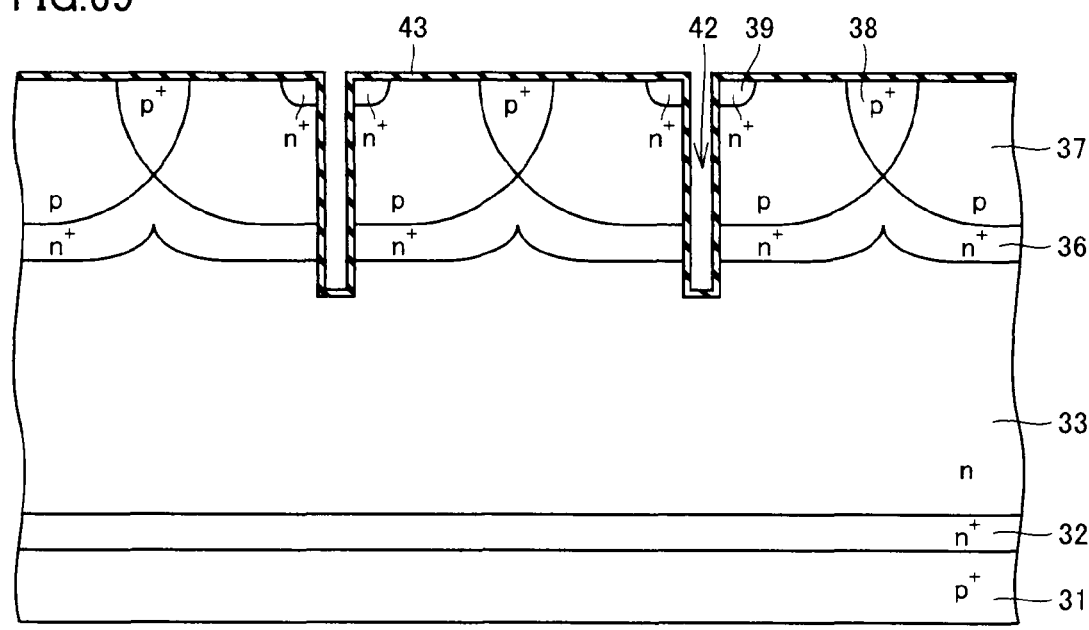

Referring to FIG. 69, gate oxide film 43 is deposited on the entire surface, which causes gate oxide film 43 covering the sidewall of trench 42 to be formed (FIG. 3: step S15c). Gate oxide film 43 has a film thickness of, for example, 0.1 μm.

Figure 70:
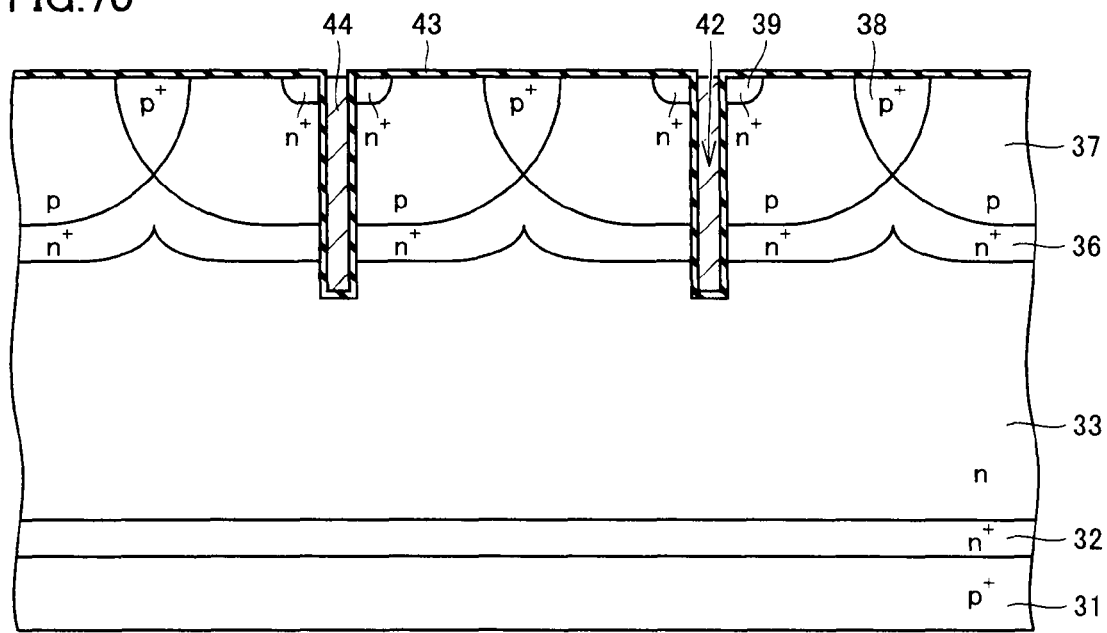

Referring to FIG. 70, a conductive polysilicon film is deposited on the entire surface and then etched back. Consequently, the polysilicon film is remained only inside trench 42 to thereby form trench gate 44 filling trench 42 on gate oxide film 43 (FIG. 3: step S15d).

Figure 71:
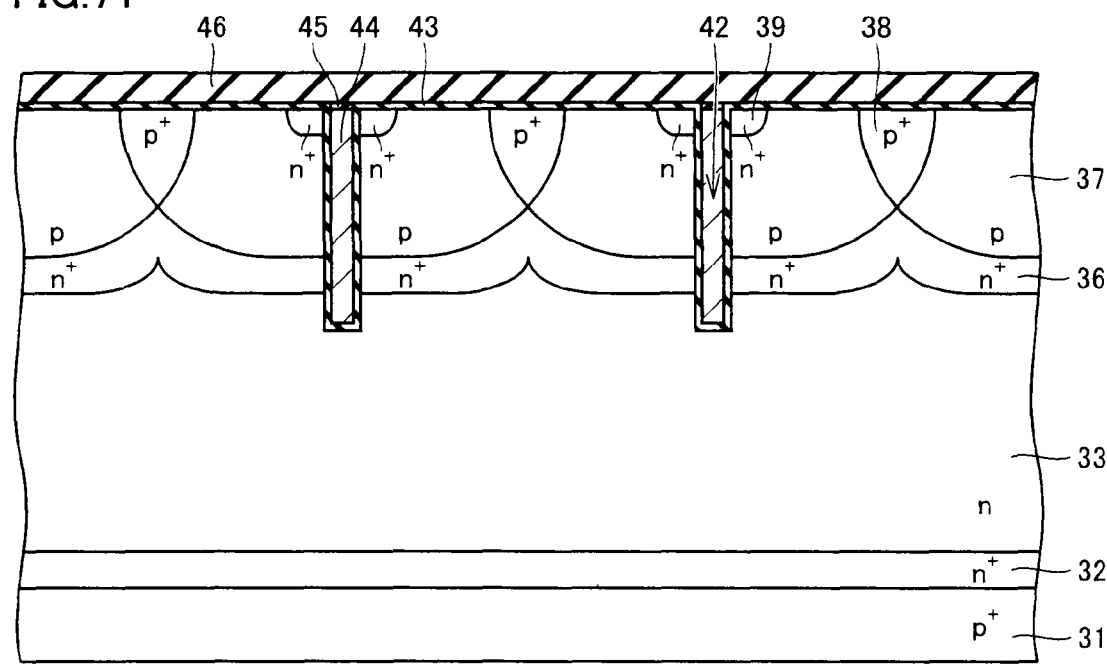

Referring to FIG. 71, oxide film 13 is formed in order to insulate trench gate 44, and oxide film 46 for insulating the gate electrode is further formed on the entire upper surface. Oxide film 46 has a film thickness of, for example, 1 μm.

Figure 72:
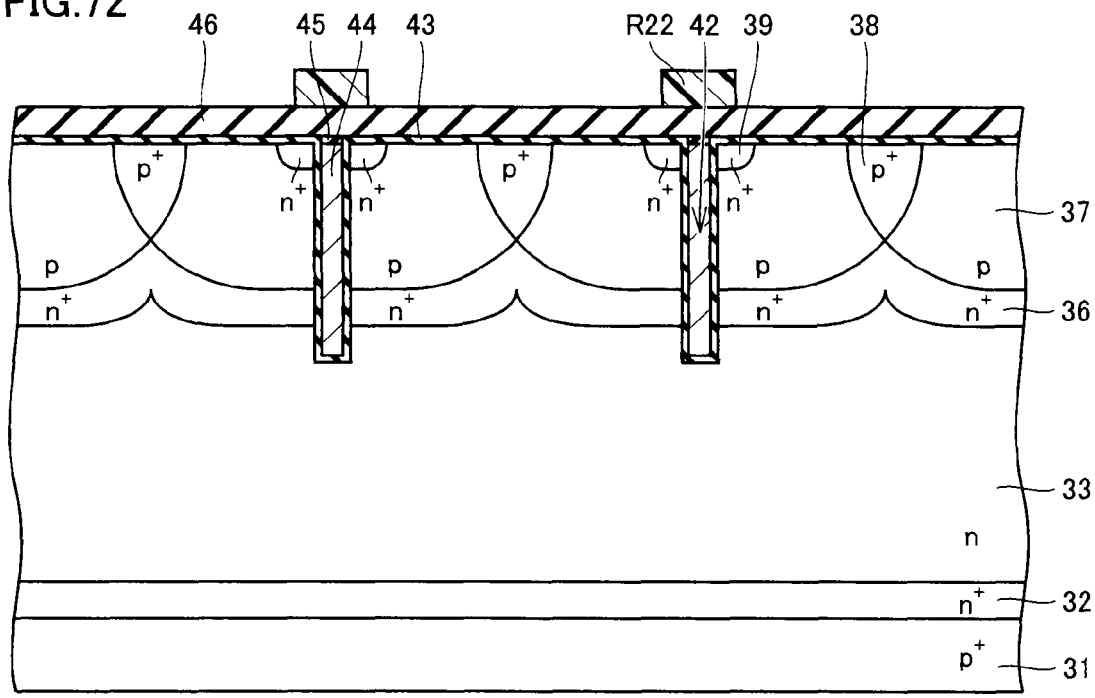
Figure 73:
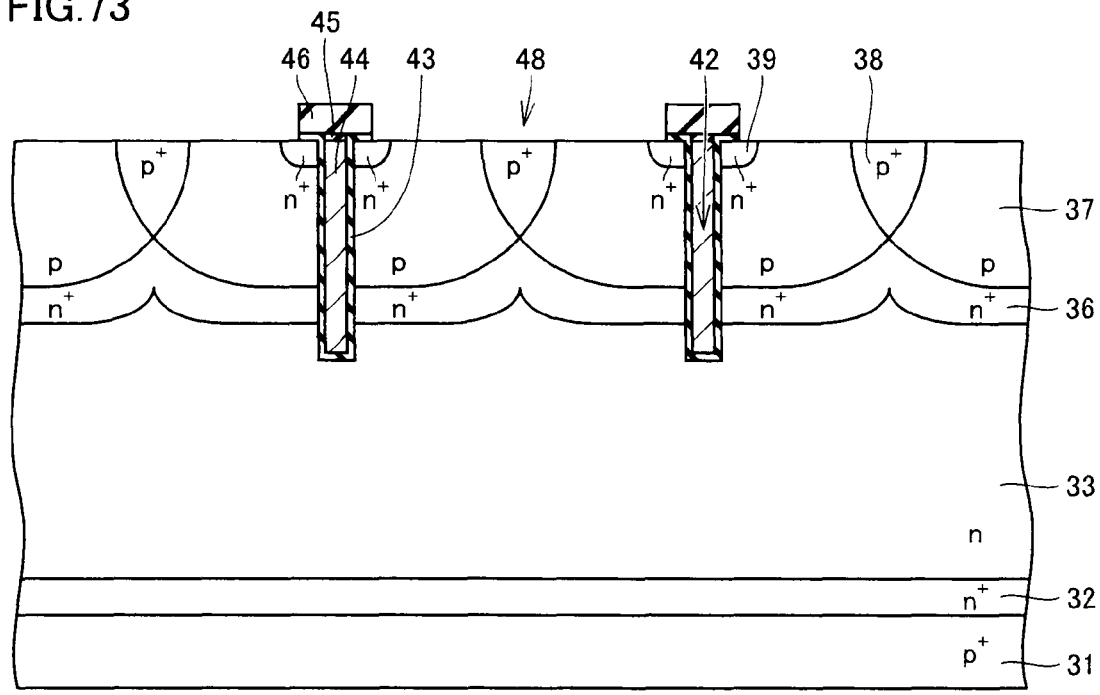

Referring to FIGS. 72 and 73, a second resist pattern R22 is formed on oxide film 46 by photolithography. Second resist pattern R22 has an opening corresponding to emitter contact 48 (FIG. 51).

As second resist pattern R22 is used as a mask to etch oxide film 46, emitter contact 48 is formed. Emitter contact 48 has a width of, for example, 8 μm.

Figure 74:
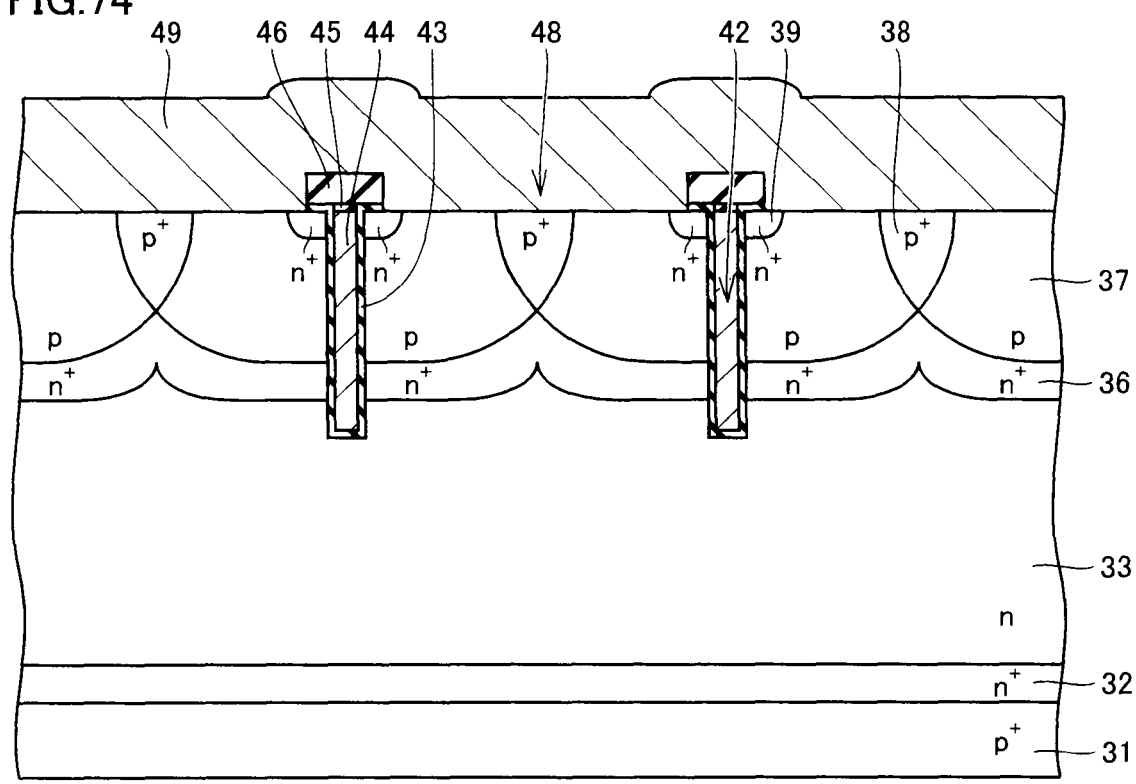

Referring to FIG. 74, emitter electrode 49 is formed (FIG. 52: step S27). Emitter electrode 49 is made of material such as aluminum or aluminum silicon, for example. The film thickness of emitter electrode 49 can be arbitrarily set. More specifically, for example, emitter electrode 49 is made of aluminum to which 1% of silicon is added, and has a film thickness of 3.6 μm.

Referring back to FIG. 51, collector electrode 50 is formed on the rear surface (underside surface in FIG. 51) of $p^+$ semiconductor region 31 (FIG. 52: step S28), to thereby provide a power semiconductor device D2.

Although not explained in the above description, the process of cleaning the wafer, the mask oxidation formation process during boron implantation, the process of forming the gate electrode for electrical connection to the trench gate, the process of forming the overcoating film after formation of the emitter electrode, the process of forming barrier metal, and the process of grinding the rear surface of the semiconductor substrate may be performed.

According to the present embodiment, in the case where the power semiconductor device is a carrier-accumulation-type IGBT, the same effects as those obtained in the first embodiment can be achieved.

Figure 75A:
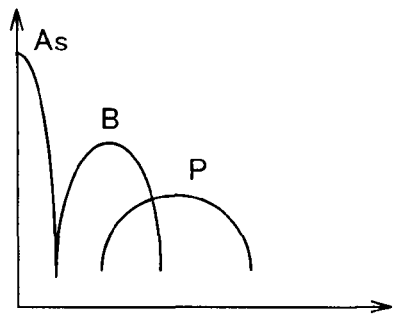
FIG. 75A shows an impurity profile of the power semiconductor device immediately after ion implantation according to the third embodiment of the present invention.
Figure 75B:
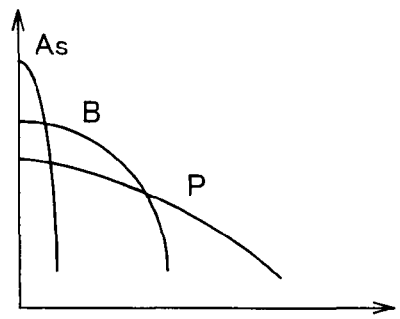
FIG. 75B shows an impurity profile of the power semiconductor device after drive-in according to the third embodiment of the present invention.

In the ion implantation process according to the present embodiment, since the acceleration energy of about 150 keV is applied, phosphorus (P) is implanted into a relatively shallow region as shown in FIG. 75A. Accordingly, as shown in FIG. 75B, phosphorus (P) remains in a relatively shallow region even after drive-in. Therefore, a significant effect of counter-doping with phosphorus (P) is exerted on p base region 37 formed by adding boron (B).

Figure 76A:
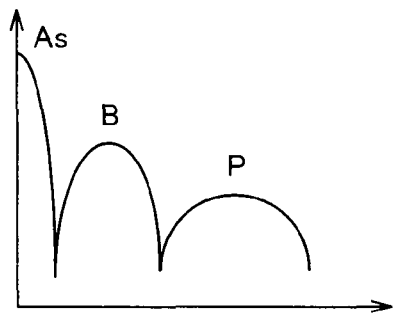
FIG. 76A shows an impurity profile of the power semiconductor device immediately after ion implantation in the first modification according to the third embodiment of the present invention.
Figure 76B:
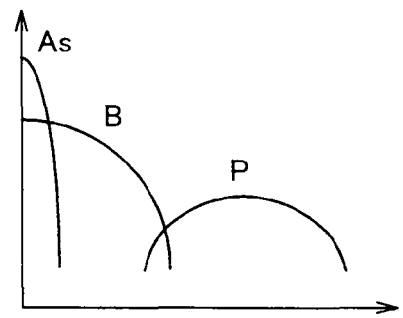
FIG. 76B shows an impurity profile of the power semiconductor device after drive-in in the first modification according to the third embodiment of the present invention.

In order to reduce the effect of counter-doping, the acceleration energy conditions for an ion implanter may be set to an MeV level for implanting phosphorus (P). This causes phosphorus (P) to be implanted into a relatively deep region as compared to the present embodiment, as shown in FIG. 76A. Accordingly, as shown in FIG. 76B, since phosphorus (P) is concentrated in a deeper region even after drive-in, the effect of counter-doping is reduced. Consequently, the stabilization of the threshold voltage of the transistor can be expected.

Figure 77:
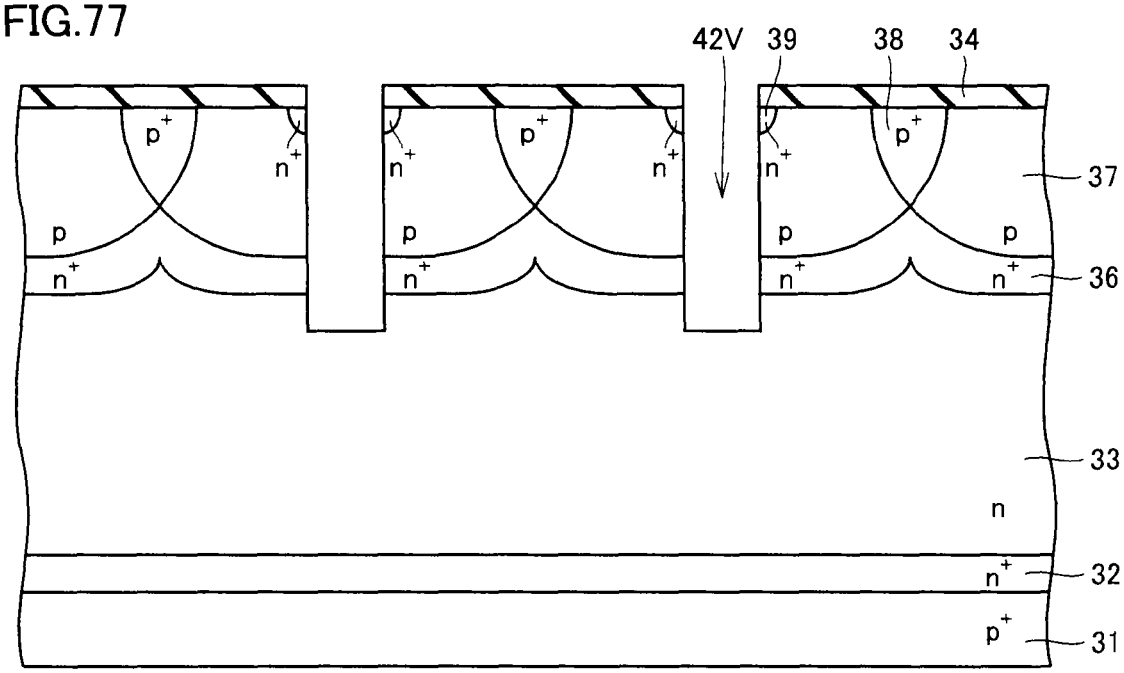
FIG. 77 is a partial cross-sectional view schematically showing a process of the method of manufacturing the power semiconductor device in a second modification according to the third embodiment of the present invention.

Although, in the present embodiment, sidewall oxide film 41 (FIG. 66) is formed in accordance with step S15a (FIG. 3), formation of sidewall oxide film 41 may be eliminated for further simplifying the manufacturing method. In this case, since the etching mask does not include sidewall oxide film 41 (FIG. 66), a trench 42V (FIG. 77) formed by this etching mask is greater in width than trench 42 (FIG. 67).

It is to be noted that although the first and second conductivity types correspond to an n-type and a p-type, respectively, in the description of each embodiment as described above, the present invention is not limited thereto, and the first and second conductivity types may correspond to a p-type and an n-type, respectively.

Furthermore, although the epitaxial growth method has been described as a method of forming a wafer (semiconductor substrate) having a multilayer structure, the present invention is not limited thereto and a wafer may be formed, for example, by the FZ (Floating Zone) method.

Furthermore, although the method by which the $n^+$ source region or $n^+$ emitter region (the third layer) is formed before forming the sidewall oxide film (sidewall film) has been described, the present invention is not limited thereto, and the $n^+$ source region or $n^+$ emitter region (the third layer) may be formed after forming the sidewall oxide film (sidewall film).

Furthermore, although the case where the power semiconductor device is a silicon device has been described, the present invention is not limited thereto, and the power semiconductor device may be a silicon carbide device which has been recently developed and is expected to achieve a high efficiency.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a power semiconductor device, comprising:
    preparing a semiconductor substrate having one main surface and an other main surface, and including a first layer having a first conductivity type and located at a side of said one main surface;
    forming a mask layer having a plurality of openings on said first layer;
    forming a second layer having a second conductivity type different from said first conductivity type on said first layer by introducing impurities using said mask layer;
    forming a third layer having said first conductivity type on said second layer by introducing impurities using said mask layer;
    forming a trench extending through said second layer and said third layer to said first layer by carrying out etching using an etching mask including at least said mask layer;
    forming a gate insulation film covering a sidewall of said trench;
    forming a trench gate filling said trench on said gate insulation film; and
    after said forming said second layer, forming a sidewall film on a sidewall of said mask layer in order to narrow said plurality of openings, wherein said etching mask includes said sidewall film.

2. The method of manufacturing a power semiconductor device according to claim 1, wherein said forming said second layer comprises forming a high concentration region which is higher in impurity concentration at a surface side than said second layer by introducing impurities from each of a pair of openings adjacent to each other among said plurality of openings into a region of said first layer covered with said mask layer.

3. The method of manufacturing a power semiconductor device according to claim 1, wherein
    said plurality of openings of said mask layer are arranged at a pitch in one direction and each have a width in said one direction, and
    said pitch is smaller than a sum of said width and a value of 1.6 times of a diffusion depth of said second layer.

4. The method of manufacturing a power semiconductor device according to claim 1, further comprising forming a semiconductor region having said second conductivity type on said other main surface of said semiconductor substrate.

5. The method of manufacturing a power semiconductor device according to claim 4, further comprising forming a carrier accumulation layer having said first conductivity type on said first layer by introducing impurities using said mask layer, wherein
    said forming said second layer is performed by forming said second layer on said first layer with said carrier accumulation layer interposed there between.

6. The method of manufacturing a power semiconductor device according to claim 5, wherein said forming said carrier accumulation layer is performed using an ion implanter.

7. The method of manufacturing a power semiconductor device according to claim 1, wherein said semiconductor substrate includes a semiconductor region having said second conductivity type and located at a side of said other main surface.

8. The method of manufacturing a power semiconductor device according to claim 7, further comprising forming a carrier accumulation layer having said first conductivity type on said first layer by introducing impurities using said mask layer, wherein
    said forming said second layer is performed by forming said second layer on said first layer with said carrier accumulation layer interposed there between.

9. The method of manufacturing a power semiconductor device according to claim 8, wherein said forming said carrier accumulation layer is performed using an ion implanter.

* * * * *